US010835999B2

(12) United States Patent
Ryder et al.

(10) Patent No.: US 10,835,999 B2
(45) Date of Patent: Nov. 17, 2020

(54) SOLDER FLUX

(71) Applicant: UNIVERSITY OF LEICESTER, Leicester (GB)

(72) Inventors: Karl Ryder, Leicester (GB); Andrew Ballantyne, Leicester (GB); Robert Harris, Leicester (GB); Christopher Zaleski, Leicester (GB)

(73) Assignee: UNIVERSITY OF LEICESTER, Leicester (GB)

( * ) Notice: Subject to any disclaimer, the term of this patent is extended or adjusted under 35 U.S.C. 154(b) by 712 days.

(21) Appl. No.: 15/316,608

(22) PCT Filed: Jun. 5, 2015

(86) PCT No.: PCT/GB2015/051655
§ 371 (c)(1),
(2) Date: Dec. 6, 2016

(87) PCT Pub. No.: WO2015/185946
PCT Pub. Date: Dec. 10, 2015

(65) Prior Publication Data
US 2017/0157717 A1 Jun. 8, 2017

(30) Foreign Application Priority Data

Jun. 6, 2014 (GB) .................................. 1410093.7

(51) Int. Cl.
*B23K 35/362* (2006.01)
*B23K 1/00* (2006.01)
*B23K 35/02* (2006.01)
*B23K 35/36* (2006.01)
*H05K 3/34* (2006.01)

(52) U.S. Cl.
CPC .......... *B23K 35/362* (2013.01); *B23K 1/0016* (2013.01); *B23K 35/025* (2013.01); *B23K 35/0227* (2013.01); *B23K 35/3602* (2013.01); *B23K 35/3605* (2013.01); *B23K 35/3606* (2013.01); *B23K 35/3611* (2013.01); *B23K 35/3618* (2013.01); *H05K 3/34* (2013.01); *H05K 3/3489* (2013.01)

(58) Field of Classification Search
CPC ............... B23K 35/362; B23K 1/0016; B23K 35/0227; B23K 35/3602; B23K 35/3605; B23K 35/3611; B23K 35/3606; B23K 35/35; B23K 35/3618; H05K 3/34; H05K 3/3489
USPC ....................................................... 148/23
See application file for complete search history.

(56) References Cited

U.S. PATENT DOCUMENTS 3,436,278 A * 4/1969 Poliak ................ B23K 35/3612
106/287.24
2011/0100690 A1 * 5/2011 Yoshimura ............... H01B 1/02
174/259

FOREIGN PATENT DOCUMENTS

WO          2007003956 A2       1/2007

OTHER PUBLICATIONS

Ballantyne et al., "Sustainable solder flux from novel ionic liquid solvents: greener, cleaner, cheaper", Annual IeMRC Conference Sep. 25, 2013 , cited in IDS (Year: 2013).*
Tang et al., "Recent Developments in Deep Eutectic Solvents in Chemical Sciences", Monatsch. Chem. 144 (2013) 1427-1454. (Year: 2013).*
Haramagatti et al., "Surfactant solubility and micellization in ternary eutectic melt (acetamide + urea + ammonium nitrate)", Colloids and Surfaces A: Physicochem. Eng. Aspects vol. 403 (2012) 110- 113. (Year: 2012).*
Liu et al. , "Synthesis and characterization of novel ternary deep eutectic solvents", Chinese Chemical Letters 25 (2014) 104-106. (available online Oct. 23, 2013) (Year: 2013).*
Rong et al., "Glutamic Acid Cation Based Ionic Liquids: Microwave Synthesis, Characterization, and Theoretical Study", J. Phys. Chem. B 112 (2008) 1451-1455. (Year: 2008).*
Zhang et al., "Deep Eutectic Solvents: syntheses, properties and applications", Chem. Soc. Rev. 41 (2012) 7108-7146. Cited in IDS. (Year: 2012).*
Abbott et al., "Processing of Electric Arc Furnace Dust Using Deep Eutectic Solvents", Aust. J. Chem. 62 (2009) 341-347. (Year: 2009).*
Abbott et al., Electrodeposition of Nickel Using a Eutectic Based Ionic Liquid, T~tNs IMF, 2008, 86, 234.
Abbott et al., Electroless Deposition of Metallic Silver From a Choline Chloride Based Ionic Liquid: A Study Using Acoustic Impedance Spectroscopy, Sem and Atomic Force Microscopy, Phys. Chem. Chem. Phys, 2007, 9, 3735.
Abbott et al., Electrolytic Processing of Super-Alloy Aerospace Castings Using Choline Chloride-Based Ionic Liquids, Tt~Ns IMF, 2012, 90(1), 9.
Abbott et al., Electropolishing of Stainless Steels in a Choline Chloride Based Ionic Liquid: An Electrochemical Study With Surface Characterisation Using Sem and Atomic Force Microscopy, Phys. Chem. Chem. Phys., 2006, 8, 4214.
Abbott et al., Ionometallurgy: Designer Redox Properties for Metal Processing, Chem. Commun., 2011, 47, 10031.
Abbott et al., Pilot Trials of Immersion Silver Deposition Using a Choline Chloride Based Ionic Liquid, Circuit World, 2010, 36(1), 3.

(Continued)

*Primary Examiner* — Ronald Grinsted
(74) *Attorney, Agent, or Firm* — McCarter & English, LLP; Steven G. Davis; Mei Bai

(57) ABSTRACT

There is provided the use of at least one ionic liquid as a soldering/brazing flux. There is also provided a method of soldering a metal comprising applying a solder/braze comprising a flux to a surface of the metal and heating said metal to a desired soldering/brazing temperature, wherein the soldering/brazing flux comprises one or more ionic liquids.

16 Claims, 16 Drawing Sheets

(56) References Cited

OTHER PUBLICATIONS

Abbott et al., Processing of Metals and Metal Oxides Using Ionic Liquids, Green Chem., 2011, 13, 471.

Abbott et al., Sustained Electroless Deposition of Metallic Silver From a Choline Chloride-Based Ionic Liquid, Surf. Coat. Tech., 2008, 202, 2033.

Abbott et al., Voltammetric and Impedance Studies of the Electropolishing of 316 Stainless Steel in Choline Chloride/Ethylene Glycol Mixtures, Electrochimica Acta, 2006, 51, 4420.

Ballantyne et al., Advanced Surface Protection for Improved Reliability PCB Systems (Aspis), Circuit World, 2012, 38(1), 21.

Beyersdorff et al., Electrodeposition in Ionic Liquids, 2008, Chapter 2 (Synthesis of Ionic Liquids), ISBN 978-3-527-31565-9.

Fima et al, Wetting of Sn-Zn-Xin (X=0.5,1.0, 1. WT.%) Alloys on Cu and Ni Substrates, .I. Mat. Eng. and Performance, 2012, 21(5), 595.

Gamburg et al., Theory and Practice of Metal Electrodeposition, Springer, 2011, Chapters 13-15, ISBN 978-1-4419-9668-8.

Gancarz et al., Thermal Properties and Wetting Behaviour of High Temperature Zn-Al-In Solders, .I. MAT. Eng. and Performance, 2012, 21(5), 599.

Gao et al., Effect of Surface Oxide on the Melting Behaviour of Lead-Free Solder Nanowires and Nanorods, Applied Surface Science, 2012, 258, 7507.

Graedel et al., The Impact of Environmental-Issues on Materials and Processes, AT&T Technical Journal, 1990, 69(6), 129.

Guth, Low Solids Flux Technology for Solder Assembly of Circuit Packs, IEEE 39T Proceedings of the Electronic Components Conference, 1989, 748.

Latham et al., Passive Film Formation in Dilute Ionic Liquid Solutions on Magnesiuma—OYAZ31, Electrochem. Commun., 2012, 19, 90.

Lin et al., Enhanced Wettability of Oxidized Copper With Lead Free Solder, Sold. &Surf. Mount Tech., 2012, 24(3), 183.

Pstrus et al., Wetting of Cu and Al by Sn-Zn and Zn-Al Eutectic Alloys, Mat. Eng. and Performance, 2012, 21(5) 606.

Smith et al., Metal Finishing With Ionic Liquids; Scale-Up and Pilot Plants From the Ionmet Consortium, TR,4Ns IMF, 2010, 88(6), 285.

Wang Etal., Drop Impact Reliability of SM-1.0 AG-0.5CU BGA Interconnects With Different Mounting Methods, Microelectronics Reliability, 2012, 52, 1475.

Zhang et al., Deep Eutectic Solvent: Synthesis, Properties and Application, Chem. Soc. REv., 2012, 41, 7108-7146.

Zhang et al., on Corrosion Behaviour of Magnesium Alloy AZ31 in Simulated Body Fluids and Influence of Ionic Liquid Pretreatments, Corrosion Engineering Science and Technology, 2012, 47(5), 374.

UK Search Report issued in UK 1410093.7, dated Dec. 2014.

Ballantyne, "iTRi-Deep eutectic solvents the key to fluxless soldering", Retrieved from internet: https://www.itri.co.uk/index.php?option=com_zoo&tast=item_id=2868&Itemid=161; Sep. 15, 2013.

Ballantyne et al., "Sustainable solder flux from novel ionic liquid solvents: greener, cleaner, cheaper" Univ. of Leicester, IEMRC Conference, Sep. 25, 2013.

\* cited by examiner

SOLDER FLUX

RELATED APPLICATION INFORMATION

This application is a 371 of International Patent Application No. PCT/GB2015/051655, filed Jun. 5, 2015, which claims priority to GB Patent Application No. 1410093.7, filed Jun. 6, 2014. The contents of each application are herein incorporated by reference.

This invention relates to the use of ionic liquids in soldering and brazing, and in particular to using Deep Eutectic Solvents (DES) as soldering and brazing fluxes.

Soldering is a technique used to join two pieces of metal together, for example copper, using a second low-melting metal such as tin (and formerly lead-tin alloy). Brazing is also a metal-joining process which is similar to soldering, except that the temperatures used to melt the filler metal are higher for brazing.

These techniques are widely used in the construction and plumbing industries to join copper pipes in water circuits such that the joints have inherent mechanical strength and are leak-free. Soldering and brazing are also used extensively in the manufacture of printed circuit boards (PCBs) and the connection and construction of added components as well as the assembly of a wide variety of computer equipment, mobile phones and a full range of consumer electronics.

The join between two pieces of metal is formed by running the molten solder/braze between the metal such that when this sets there exists a solid metal to metal bond. This is often incorrectly referred to as welding. However, welding is done at much higher temperatures using electrical discharge or flame.

To facilitate a strong join between the two pieces of metal, a flux is used. Flux is a chemical formulation that improves the wetting of the metal surface by the molten solder/braze and prevents oxidised metal forming underneath the bonding surfaces. The latter mechanism can lead to poor joints and failure (either mechanical or electrical).

The role of a flux in joining processes is typically dual: dissolving of the oxides on the metal surface, which facilitates wetting by molten metal, and acting as an oxygen barrier by coating the hot surface, preventing its oxidation. In some applications molten flux also serves as a heat transfer medium, facilitating heating of the joint by the soldering/brazing tool or molten solder/braze.

As mentioned already above, soldering is used as a key process step for assembly of components onto PCBs but also for sub-assembly of complex components such as sensors, accelerometers, and chips. At PCB level, assembly is often achieved using wave soldering machines in which the boards are subjected to the molten solder prior to component attachment. There are often several stages of metal-metal bonding in such technologies many of which are facilitated by solder/braze joins.

Conventional solder/braze fluxes are commonly formulated from plant-extract resins (Rosin), or inorganic metal salts and have various activators that decompose at soldering/brazing temperatures liberating corrosive vapours such as hydrochloric acid. In addition to this, the flux itself often decomposes producing characteristic and noxious gasses (flux-fumes) as well as decomposition residues that have to be removed with organic solvents. Whilst there are some commercial water soluble no-clean fluxes, ionic residues on PCB surfaces remain a major concern for the industry with respect to extended life and failure mechanisms.

Manufacture of Rosin based fluxes is accomplished through refinement of tree sap. This has two intrinsic problems. The first is high economic cost and the second is consistency of formulation i.e. poor quality control. Existing Rosin manufacture often produces large variations in colour and function. This problem is well known in the industry and has resulted in a complex and volatile market culture for acquisition of solder/braze flux. For example high value/volume manufacturers reserve quotas of high quality flux, subsequently flux quality is graded downward by value, opportunity or market size. This leaves even large manufacturers vulnerable to market and supply fluctuations.

Finally many common component assembly processes e.g. flip-chip, PZT sensors or accelerometers, as well as PCB assembly processes such as direct heat-sink bonding require joining of a variety of metals and conducting substrates including Si, Ti, Al, Ni, Ag, Au. A range of joining technologies is utilised by the industries since the soldering process alone cannot accomplish these. This is largely because of problems activating reactive metal surfaces and removing metal oxide to facilitate solder/braze wetting.

Thus, the problem with conventional solder/braze fluxes for electronics manufacture is that they are expensive, give off toxic and noxious fumes in use, are inconsistent in manufacture and do not function well for bonding of reactive metals. These issues, particularly surrounding environmental impact and functionality, have been known for some time and there is increasing interest in improving joint strength and substrate wettability (see "Low Solids Flux Technology for Solder Assembly of Circuit Packs", L. A. Guth, IEEE 39$^{th}$ Proceedings of the Electronic Components Conference, 1989, 748; and "The Impact of Environmental-Issues on Materials and Processes" T. E. Graedel and L. A Guth, AT&T Technical Journal, 1990, 69(6), 129).

Recent studies have concentrated on the influence of flux formulation on bond strength and the importance of flux in small scale assembles (see Bo Wang et al, Drop impact reliability of Sn-1.0Ag-0.5Cu BGA interconnects with different mounting methods, Microelectronics Reliability, 52, 1475, 2012; and Fan Gao et al, Effect of surface oxide on the melting behavior of lead-free solder nanowires and nanorods, Applied Surface Science, 258, 7507, 2012.).

However, in addressing the bonding of reactive metals most studies have focused on development of specialist solders, for example for wetting of Cu, Al, Zn—Sn, Zn—Al and Sn, —Zn—In substrates and alloys, or high temperature regimes or exotic plasmas rather than seeking a more effective flux (see Janusz Pstrus et al, Wetting of Cu and Al by Sn—Zn and Zn—Al Eutectic Alloys, J. Mat. Eng and Performance, 21(5), 606, 2012; and Y. S. Lin et al, Enhanced wettability of oxidized copper with lead free solder . . . , Sold. & Surf. Mount Tech., 24(3), 183, 2012).

The Applicants have surprisingly discovered that the above problems can be overcome using ionic liquid solvent technology. In particular, Deep Eutectic Solvents (DES) can be used as alternative soldering/brazing fluxes which can exist in different physical forms e.g. liquid or paste.

The Applicants have also discovered that certain additives can improve solder flux functionality.

The DES according to the present invention are compatible with the already existing manufacturing infrastructure and can be used for wave or reflow soldering/brazing and thus can provide a simpler, cleaner, greener and generic technology that has low toxicity, lower cost and lower environmental impact.

Additionally the DES fluxes of the present invention reduce post-assembly cleaning requirements, which leads to production cost reductions and improved in-service reliability. The DES technology has potential to outperform existing materials and methodologies as well as creating additional applications to tackle difficult problems, for example, direct heat sink bonding, Al to Cu.

Ionic liquids constitute a class of chemical species which can be described in many ways (see, for example, Abbot et al. What is an ionic liquid? Application of Hole theory to define ionic liquids by their transport properties. *J Phys. Chem B*, 111: 4910-4, 2007), in which it has been suggested that most ionic systems can be described by an equilibrium:

cation+anion+complexing agent⇌cation+complex anion or potentially:

cation+anion+complexing agent⇌complex cation+anion with the majority falling under the category of the former case. This also applies to some ionic liquids that are thought of as having a discrete anion, for example:

$$Cat^+ + F^- + BF_3 \rightleftharpoons Cat^+ + BF_4^-$$

The equilibrium is simple and lies far to the right of the equation with negligible F⁻ in a dry environment. As the strength of the complexing agent decreases, a variety of complex anions are possible. Hence the well-known chloroaluminate system, which was probably the first well studied ionic liquid, can be described by:

$$2\ CatCl + 3\ AlCl_3 \rightleftharpoons 2Cat^+ + AlCl_4^- + Al_2Cl_7^-$$

Other metal halides such as $ZnCl_2$ and $SnCl_2$ form similar complexes (see, for example, Abbott et al. Preparation and applications of novel ionic liquids based on metal chloride/ substituted quaternary ammonium salt mixtures. *Inorg. Chem.*, 43: 3447, 2004).

Type III Deep Eutectic Solvents are types of ionic liquids which do not include metallic species in the bulk liquid but use a hydrogen bond donor (HBD), such as urea or ethylene glycol to complex the anion from the salt (see, for example, Abbott et al. Novel solvent properties of choline chloride/ urea mixtures. *Chem. Comm.*, 70, 2003; and Abbott et al. Deep Eutectic solvents formed between choline chloride and carboxylic acids, *J. Am. Chem. Soc.*, 26: 9142, 2004).

$$Cat^+Cl^- + HBD \rightleftharpoons Cat^+ + Cl^- \cdot HBD$$

Others have even proposed that a conventional inorganic salt with a small concentration of water produces a liquid with properties akin to an ionic liquid (see, for example, Xu W et al., Solvent-free electrolytes with aqueous solution-like conductivities. *Science*, 2003 422-425). For example:

$$LiClO_4 + 3.5H_2O \rightleftharpoons Li^+ \cdot xH_2O + ClO_4^- \cdot yH_2O$$

This idea has recently been extended to include metal salts with complexants such as acetonitrile, MeCN (see, for example, Schaltin et al., High current density electrodeposition from silver complex ionic liquids. *J. Phy Chem. Chem. Phys.*, 14: 1706-1715, 2012). For example:

$$AgTf_2N + MeCN \rightleftharpoons Ag^+ \cdot MeCN + Tf_2N^-$$

Surprisingly, metal salts such as $AlCl_3$ and $ZnCl_2$ have been found to disproportionate to give both anionic and cationic metal containing species (see, for example, Abood et al, Do all ionic liquids need organic cations?, *Chem. Comm.*, 47: 3523-3527, 2011). See, for example:

$$2AlCl_3 + n\text{Amide} \rightleftharpoons [AlCl_2 \cdot n\text{Amide}]^+ + AlCl_4^-$$

Additionally metal hydrate salts can be used with HBDs to formulate active ingredients. For example:

$$CrCl_3 \cdot x(H_2O) + y(HBD) \rightleftharpoons CrCl_2^+ \cdot x(H_2O) \cdot y(HBD) + Cl^- \cdot H_2O.$$

According to the present invention there is provided a soldering/brazing flux comprising at least one ionic liquid and at least one additive which improves flux functionality.

The terms "soldering" and "brazing" as used herein would be understood by the skilled person to mean processes in which two or more metal substrates are joined together by melting and flowing a filler metal (solder/braze) into the joint, the filler metal having a lower melting point than the adjoining metal.

Metals which are typically used in soldering/brazing processes include, but are not limited to: iron, lead, copper, chromium, antimony, nickel, magnesium, tin, stainless steel, cast iron steel, mild steel, silver, platinum, gold, palladium, aluminium, cobalt, indium, bismuth, zinc, cadmium and generally alloys containing these metals.

Solder generally falls in to one of three types, a lead alloy solder, a lead-free solder or a silver alloy solder. Lead based solder is solder that is made from an alloy of tin and lead, sometimes with other metals as well.

Lead alloy solder has been the standard solder used for decades, but the health issues associated with lead have necessitated a move away from lead based solders. Silver alloy solder can be either lead-free or combined with lead. Silver was originally added to lead alloy solder to prevent an effect known as silver migration when silver plated components where soldered.

Soldering/brazing materials which can be used according to the present invention, include, but are not limited to, tin-based (lead free), tin-lead, tin-antimony, tin-zinc, indium-lead, indium-silver and gold-tin materials. A further example of a lead free alloy which can be used for the present invention is SAC305, which is a lead-free alloy that contains tin, silver and copper.

Preferably, wherein the ionic liquid is a Deep Eutectic Solvent (DES) selected from at least one of the following:
(i) metal salt+organic salt
(ii) metal salt hydrate+organic salt
(iii) organic salt+hydrogen bond donor
(iv) metal salt hydrate+hydrogen bond donor.

Wherein (i) describes Type I DES, (ii) describes Type II DES, (iii) describes Type III DES and (iv) describes Type IV DES.

Optionally, the DES comprises:
(a) a mixture of two or more compounds of formula (I), $$(R^+)_n(X^{n-}) \qquad (I)$$

or a hydrate thereof, wherein
n is 1, 2 or 3,
$R^+$ is a primary, secondary, tertiary, quaternary or unsubstituted ammonium cation or a quaternary phosphonium cation,
$X^{n-}$ is a monovalent, bivalent or trivalent anion; and
(b) one or more compounds of formula (IIIa) and/or one or more compounds of formula (IIIb),

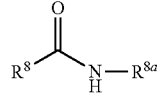
(IIIa)

HO—Y—OH, (IIIb)

wherein:
$R^8$ represents H, $C_{1-10}$ alkyl (which latter group is optionally substituted by one or more F atoms), phenyl (which latter group is optionally substituted by one or more substituents selected from halo, $C_{1-10}$ alkyl and $C_{1-10}$ alkoxy) or $N(R^9)R^{10}$, $R^{8a}$ represents H or $C_{1-10}$ alkyl (which latter group is optionally substituted by one or more F atoms), $R^9$ and $R^{10}$ independently represent H or $C_{1-10}$ alkyl (which latter group is optionally substituted by one or more F atoms), Y represents $C_{2-10}$ alkylene or $C_{4-8}$ cycloalkylene optionally (i) substituted by one or more substituents selected from F, OH, SH, $N(R^{11})R^{12}$ and $C_{1-10}$ alkyl (which latter group is optionally substituted by one or more substituents selected from F and OH), and/or (ii) interrupted by one or more groups selected from O, S and $NR^{13}$, and $R^{11}$ to $R^{13}$ independently represent H or $C_{1-10}$ alkyl (which latter group is optionally substituted by one or more substituents selected from F and OH).

Component (a)

In certain embodiments of the invention, component (a) is a mixture of two or more compounds of formula (I) or, particularly, a compound of formula (I). In such embodiments, $R^+$ may be a quaternary phosphonium cation or, particularly, a primary, secondary, tertiary, quaternary or unsubstituted ammonium cation.

Anion $X^{n-}$ is any monovalent, bivalent or trivalent anion. Embodiments of the invention include those in which $X^{n-}$ is an anion selected from the list comprising halide, chlorate, perchlorate, bromate, nitrate, nitrite, cyanide, cyanate, thiocyanate, hydrogencarbonate, carbonate, sulfate, hydrogensulfate, pyrosulfate, sulfite, hydrogensulfite, phosphate, monohydrogenphosphate, dihydrogenphosphate, metaphosphate, pyrophosphate, hexafluorophosphate, tetrafluoroborate, borate, diborate, triborate, tetraborate, carboxylate (e.g. any one of formate, acetate, trifluoroacetate, propionate, isobutyrate, heptanoate, decanoate, caprate, caprylate, stearate, acrylate, caproate, propiolate, ascorbate, citrate, glucuronate, glutamate, glycolate, α-hydroxybutyrate, lactate, tartrate, phenylacetate, mandelate, phenylpropionate, phenylbutyrate, benzoate, chlorobenzoate, methylbenzoate, hydroxybenzoate, methoxybenzoate, dinitrobenzoate, o-acetoxybenzoate, salicylate, nicotinate, isonicotinate, cinnamate, oxalate, malonate, succinate, suberate, sebacate, fumarate, malate, maleate, hydroxymaleate, hippurate, phthalate, terephthalate and the like) and sulfonate (e.g. any one of benzenesulfonate, methyl-, bromo- or chloro-benzenesulfonate, xylenesulfonate, methanesulfonate, trifluoromethanesulfonate, ethanesulfonate, propanesulfonate, hydroxyethanesulfonate, 1- or 2-naphthalene-sulfonate, 1,5-naphthalenedisulfonate and the like).

Particular embodiments of the invention that may be mentioned include those in which $X^{n-}$ is a monovalent anion (i.e. where n is 1), such as a monovalent anion selected from the list above (e.g. an anion selected from the list comprising fluoride, chloride, bromide, iodide, nitrate and acetate (such as bromide or, particularly, chloride)).

Particular embodiments of the invention that may be mentioned include those in which the compound of formula (I) is an ammonium salt or a primary, secondary, tertiary or, particularly, quaternary ammonium salt. In these embodiments, the anion(s) present in the salt(s) may be halide ions. In this respect, quaternary ammonium salts that may be mentioned include those selected from the list comprising benzyltrimethylammonium halide, tetrabutylammonium halide, ethylmethylimidazolium halide, acetylcholine halide and choline halide (wherein halide is fluoride, iodide, bromide or, particularly, chloride).

Component (b)

The term "organic" will be well understood by those skilled in the art. Thus, when used herein, the term "organic" includes references to uncharged chemical compounds (other than carbon, oxides of carbon, or acids of (bi) carbonate, cyanide, cyanate, thiocyanate or fulminate), whose molecules contain carbon.

The term "uncharged", when used herein in relation to component (b), refers to organic molecules (compounds) that do not bear a permanent positive or negative (electrostatic) charge on any atom within the molecule. In this respect, uncharged organic compounds are those that comprise a single, covalently-bonded molecule and that are not separated into cationic and anionic components.

Whether a compound contains a hydrogen atom that is capable of forming a hydrogen bond with $X^{n-}$ will either be evident to those skilled or can be determined by methods known to those skilled in the art (see, for example, Paul D. Beer, Philip A. Gale and David K. Smith, *Supramolecular Chemistry (Oxford Chemistry Primers)*, Oxford University Press, Oxford, 1999, and especially Chapter 3 (pages 31 to 42) and the references cited therein). For example, a titration can be conducted in which anion $X^{n-}$ is added to the dissolved compound and changes in a physical property connected with the H-atoms of the compound (e.g. a spectroscopic signal, such as an infrared or $^1$H n.m.r. signal) are monitored. For instance, the compound in question may be dissolved in a deuterated solvent (such as deuterated chloroform, dichloromethane or acetonitrile) and changes in the $^1$H n.m.r. signals from that compound monitored when aliquots of a quaternary ammonium salt (such as a tetrabutylammonium salt) having $X^{n-}$ as anion are added to the solution.

In these and other embodiments of the first aspect of the invention, the or each compound forming component (b) may be an amide or polyol.

Thus, particular embodiments of the invention that may be mentioned include those in which component (b) is one or more compounds selected from the list comprising benzamide, acetamide, N-methylurea, N,N'-dimethylurea, urea, glycerol, mannitol, xylitol, ethylene glycol and propylene glycol (e.g. one or more compounds selected from the list comprising benzamide, acetamide, N-methylurea, N,N'-dimethylurea, urea, glycerol, mannitol, xylitol and propylene glycol), or, alternatively, one or more compounds selected from the list comprising acetamide, glycerol or, particularly, urea.

Further, another particular embodiment of the invention is a mixture of:

(a) one or more compounds (e.g. one compound) selected from the list comprising benzyltrimethylammonium halide, tetrabutylammonium halide, ethylmethylimidazolium halide, acetylcholine halide and choline halide (wherein halide is fluoride, iodide, bromide or, particularly, chloride); and (b) one or more compounds (e.g. one compound) selected from the list comprising benzamide, acetamide, N-methylurea, N,N'-dimethylurea, urea, glycerol, mannitol, xylitol and propylene glycol.

Preferably, the DES is a Type I DES which is a zinc chloride:choline chloride mixture. More preferably, wherein the ratio is 5:1 to 1:10 and the mixture is applicable for soldering/brazing copper, brass, carbon steel and stainless steel.

Preferably, the DES is a Type II DES and is selected from:

chromium trichloride hexahydrate:choline chloride mixture. Preferably, wherein the molar ratio is 5:1 to 1:10 (also including mixtures containing up to 25% wt additional water) and the mixture is applicable for soldering/brazing of stainless steel, carbon steel, copper and aluminium.

copper chloride dihydrate:choline chloride mixture. Preferably, wherein the molar ratio is 5:1 to 1:10 and the mixture is applicable for soldering/brazing of copper, brass, carbon steel and stainless steel.

tin chloride dihydrate:choline chloride mixture. Preferably, the molar ratio is 5:1 to 1:10 and the mixture is applicable for soldering/brazing of copper, brass, carbon steel and stainless steel.

Preferably the DES is a Type III DES and is selected from:

reline which is a mixture of choline chloride:urea. Preferably, wherein the molar ratio is 4:1 to 1:6 and the mixture is applicable for soldering/brazing of stainless steel, cast iron, drop forged iron, aluminium and duraluminium.

ethaline which is a mixture of choline chloride:ethylene glycol. Preferably, wherein the molar ratio is 5:1 to 1:20 and the mixture is applicable for soldering/brazing of copper, brass and bronze.

propyline which is a mixture of choline chloride:propylene glycol. Preferably, wherein the molar ratio 5:1 to 1:20 and the mixture is applicable for soldering/brazing of copper, brass and bronze.

butaline which is a mixture of choline chloride:butanediol. Preferably, wherein the molar ratio is 5:1 to 1:20 and the mixture is applicable for soldering/brazing of copper, brass and bronze.

glyceline which is a mixture of choline chloride:glycerol. Preferably, wherein the molar ratio is 5:1 to 1:20 and the mixture is applicable for soldering/brazing of copper, brass and bronze.

acetiline which is a mixture of choline chloride:acetic acid. Preferably, wherein the molar ratio is 5:1 to 1:10 and the mixture is applicable for soldering/brazing of copper, brass and bronze.

maline which is a mixture of choline chloride:malonic acid. Preferably, wherein the molar ratio is 4:1 to 1:6 and the mixture is applicable for soldering/brazing of copper, brass and bronze.

choline chloride:glucose mixture. Preferably, wherein the molar ratio is 6:1 to 1:6 and the mixture is applicable for soldering/brazing of copper, brass and bronze.

choline chloride:fructose mixture. Preferably, wherein the molar ratio is 6:1 to 1:6 and the mixture is applicable for soldering/brazing of copper, brass and bronze.

choline chloride:xylitol mixture. Preferably, wherein the molar ratio 6:1 to 1:6 and the mixture is applicable for soldering/brazing of copper, brass and bronze.

choline chloride:erythritol mixture. Preferably, wherein the molar ratio is 6:1 to 1:6 and the mixture is applicable for soldering/brazing of copper, brass and bronze.

Preferably the DES is a Type IV DES and is selected from:

aluminium trichloride:acetamide mixture. Preferably, wherein the molar ratio is 4:1 to 1:4 and the mixture is applicable for soldering/brazing of aluminium and duraluminium.

aluminium trichloride:urea mixture. Preferably, wherein the molar ratio is 4:1 to 1:4 and the mixture is applicable for soldering/brazing of stainless steel, cast iron, drop forged iron, aluminium and duraluminium.

tin chloride dihydrate:ethylene glycol mixture. Preferably, wherein the molar ratio is 4:1 to 1:4 and the mixture is applicable for soldering/brazing of copper, brass and bronze.

In accordance with the present invention, the soldering/brazing flux also comprises at least one additive which improves flux functionality. More specifically, the function of the additive is to either improve interfacial surface wetting (of the substrate/flux, solder flux or solder substrate interfaces) and/or to modify or improve the rheological properties of the flux.

Preferably, the additive which comprises flux functionality is selected from at least one of:
i. a wetting agent;
ii. a wetting agent improver; or
iii. a rheology modifier, or combinations thereof.

Optionally, wherein the wetting agent is a cationic, anionic or non-ionic surfactant.

The addition of surfactant wetting agents, such as cetyltrimethylammonium bromide (CTAB), significantly reduces the surface tension of the DES. For example, Glyceline 200 has a surface tension of 57.2 mN m$^{-1}$. However, when 10 mM of CTAB is added the surface tension is reduced to 32.0 mN m$^{-1}$.

This has important implications in its use as a soldering/brazing flux. FIG. 11(a) shows three samples of liquid that have been placed on a copper substrate. These are Glyceline 200 (left), Glyceline 200 with added CTAB bromide (centre) and Glyceline 200 with added polyoxyethylene octyl phenyl ether (Triton X100) wetting agent (right). Each of these droplets has the same surface area in contact with the substrate, a side on view shows that the pure liquid has a much higher wetting angle compared to those where wetting agents are present. This means that a much larger volume of liquid is required to cover the same surface area of sample and that more flux would be required to solder a given surface area.

More importantly, FIG. 11(b) shows what happens when this copper coupon is tilted slightly. The pure Glyceline droplet has nearly flowed off the side of the coupon, whereas the Glyceline with added CTAB has remained in place and has spread out slightly to cover even more surface area. The practical implications for soldering are that much less solder flux is required in order to solder a given region and that the flux will remain at the surface for a longer time.

Preferably, the wetting agent is selected from, but not limited to, cetyltrimethylammonium bromide, cetyltrimethylammonium chloride, polyoxyethylene octyl phenyl ether, sodium laureth sulfate, cetylpyridinium chloride, benzalkonium chloride, benzethonium chloride, ammonium laureth sulfate, sodium stearate, dioctyl sodium sulfosuccinate, sodium perfluorobutylsulfonate, polyoxyethylene glycol ethers, polyoxypropylene glycol alkyl ethers and polyoxyethylene glycol alkyl phenol ethers. Although these examples are given as chloride salts, the anion may be that of any simple inorganic salt. The skilled person is aware that the above list of surfactants is not intended to be limiting and that numerous other surfactants can also be used.

In accordance with one aspect of the present invention, the flux comprises a wetting agent improver. By wetting agent improver, the skilled person understands this to mean additives to improve solder wetting on difficult substrates. For example, stainless steels, nickel alloys or aluminium and its alloys.

According to the present invention, the wetting agent improver additive aids to lower the temperature at which surface oxide is readily removed by the solder flux, improving wetting interactions between the molten solder and the substrate to be soldered. These additives are for typically difficult to solder materials such as stainless steel, HAST (Ni based) alloys and aluminium.

Some substrates, such as copper and brass can be soldered with a wide range of DESs. However, others can be much more difficult to solder. An example of this would be stainless steel.

There are very few materials that can effectively solder stainless steel. The Applicants have discovered that the DES reline is one of those materials. There are still issues that remain with the soldering, however. Namely, that the activation temperature for the wetting of the stainless steel substrate is higher than that of the melting point of the solder.

This means that if molten solder is brought into contact with a stainless steel substrate it will form a molten ball of solder on the surface until the steel surface gets up to temperature, is activated and the solder can then wet the stainless steel substrate. This can lead to problems with the final solder joint where the solder typically covers quite a small surface area and the shape may be non-uniform (FIG. 12 (a)).

Analysis of a cross section of one of these solder joints shows the presence of voids at the interface between the solder and the stainless steel (FIG. 12 (c)). This is because of imperfect wetting of the molten solder across the surface of the stainless steel.

The addition of 1 M hydrochloric acid has the effect of lowering the activation temperature of the stainless steel surface sufficiently so that it is lower than that of the melting point of the solder. This means that as the solder melts the substrate below it is active and a solder joint can form immediately. Consequently, the solder does not form a ball on the surface (FIG. 12 (b)) and the resulting solder join is free of voiding. Thus, the addition of hydrochloric acid to Reline has the impact of dramatically improving the reliability of soldering to stainless steel substrates.

Additives for soldering of stainless steel and nickel-based alloys include, but are not limited to hydrochloric acid, hydrobromic acid, hydroiodic acid, sulphuric acid and phosphoric acid.

In the case of aluminium, fluoride containing salts are key for the efficient removal of the passive oxide layer. Suitable salts include, but are not limited to, sodium tetrafluoroborate, ammonium tetrafluoroborate, potassium fluoride, sodium hexafluorophosphate, tetrafluoroboric acid.

In accordance with a further aspect of the present invention, the additive which improves solder flux functionality is a rheology modifier and is selected from one or more of:
  i. ethylene glycol, glycerol and mixtures thereof;
  ii. a hydrophilic polymer selected from poly (N-isopropylacrylamide), poly (2-oxazoline), polyethylenimine, poly (acrylic acid), poly (vinyl alcohol), poly (vinyl pyrrolidinone), poly(allylamine), poly (vinyl sulfonic acid) and glycerol propoxylate;
  iii. a polyol selected from xylitol, erythritol, arabitol, ribitol, sorbitol and mannitol.

The rheology modifier serves to maintain the fluidity of the solder flux at low temperatures (i.e. below room temperature). In one example, ethylene glycol and glycerol were added to reline. Other examples would be: Glycerol added to Ethaline 200, glycerol added to Reline 200, ethylene glycol added to Reline 200, mixtures of propylene glycol added to Ethaline 200, Glyceline 200 and Reline 200.

Some of the liquids, such as Ethaline 200 and Reline 200, while commonly known as being liquid at room temperature, will freeze over time. The addition of 5 wt % glycerol, ethylene glycol or a mixture of ethylene glycol and glycerol can help to stabilise Reline 200 reducing the freezing point. In the case of Reline 200, the addition of 5 wt % of a 50:50 ethylene glycol/glycerol mixture results in a system that does not freeze at temperatures down to 5° C.

Practically, a solder flux which freezes at or near room temperature would encounter significant problems relating to general day to day use. The addition of the elthylene glycol/glycerol mixture means that the flux should stay in a liquid state in any reasonable workplace environment.

In Another Aspect of the Invention, the Addition of Xylitol or Polyethyleneglycol is Used to Reduce Drossing on HASL PCB Panels.

Copper soldering is demonstrably fast through solder wetting balance measurement as well as anecdotal evidence. However, in some cases other problems have been seen. In HASL soldering, where Glyceline 200 is used as a flux significant pick-up of solder dross is seen on the PCB panel (FIG. 14 (a)). This is due to the high temperatures at which soldering takes place (270° C. for HASL coating) significant evaporation of glycerol occurs meaning that when the PCB panel is removed from the solder bath the flux is not acting as a lubricant for the solder to be removed from the surface of the PCB solder mask.

Xylitol and polyethyleneglycol 400 have been added to the Glyceline to improve the persistence of the flux at these high temperatures. Presence of these additives means that the PCB panels can be HASL coated using these fluxes, ensuring that no solder dross is present on the surface of the PCB panel when it is removed from the HASL coater (FIG. 14 (b)). Other examples are erythritol, arabitol, ribitol, sorbitol, mannitol and benzamide.

In a further aspect of the present invention, are additives which ensure solder flux paste compatibility.

Often solder fluxes are sold in "gel" format. Typically these are multi component systems where the flux has been gelled using a substance such as petroleum jelly (a wax made from medium to long chain hydrocarbons). In the case of DESs this system is usually incompatible; while the two will mix together they will readily phase separate into wax and liquid respectively.

Using a polyethyleneglycol wax of mixed chain lengths and mixing this with a DES such as Reline 200 changes the physical property of the flux from liquid to gel (FIG. 13 (a)) without any reduction in solderability.

This gelled flux can then be mixed with a solder powder to produce a solder paste. Solder paste is one of the most common materials used in automated soldering processes. Electronics assembly is typically performed by producing solder joints between components and the printed circuit board. This is achieved through the selective printing of a solder paste onto the printed circuit board through screen printing through a stencil.

This far we have demonstrated that these DES/polyethyleneglycol solder pastes have good screen printing characteristics and that the screen printed paste can be used to solder a variety of PCB surface finishes such as copper, electroless nickel and electroless nickel immersion gold.

A hydrophilic polymer additive is used in order to form a gel when mixed with the deep eutectic solvent. This can then be mixed with solder powder to form a solder paste. Other examples are poly(N-isopropylacrylamide), poly(2-oxazoline), polyethylenimine, poly(acrylic acid), poly(vinyl alcohol), poly(vinylpyrrolidinone), poly(allylamine), poly(vinylsulfonic acid) and glycerol propoxylate.

Optionally, wherein the above mixtures additionally comprise one or more additives selected from alkali metal halides or alkali metal hydroxides (such as sodium hydroxide and lithium chloride); polymers (such as polyethylene glycol (PEG) and xanthan gum); cationic, anionic or neutral surfactants (such as sodium dodecyl sulphate (SDS)); and organic compounds (such as oxalic acid, ethylenediamine and ethylenediaminetetraacetic acid).

Preferably wherein the flux is formulated from non-toxic bulk commodity chemicals selected from choline chloride, ethylene glycol, propylene glycol or glycerol and so will represent a greener and more sustainable future prospect for PCB manufacturing and assembly.

Preferably, wherein the flux according to the present invention is in the form of a liquid or a paste.

In another embodiment of the invention the DES flux may be diluted with a solvent (including but not limited to water, alcohols, esters, glycols, carbonates and other common solvents).

In a further embodiment of the present invention there is provided a composite cored solder/braze comprising a hollow cylinder of solder/braze, said hollow containing a flux, wherein said flux comprises one or more ionic liquids.

In another embodiment of the present invention there is a method of soldering/brazing a metal comprising applying a solder/braze comprising a flux to a surface of the metal and heating said metal to a desired soldering/brazing temperature, wherein the soldering/brazing flux comprises one or more ionic liquids. The solder/braze has a melting point below that of the metal and is used to join metal workpieces.

The heating of the tiller metal can be accomplished by various methods, including hot plate, induction, torch and furnace.

The term "desired soldering/brazing temperature", when used in relation to the soldering/brazing methods described herein refers to:
when soldering is performed using metal or alloys with a melting range of 90 to 450° C.
when brazing is performed using metal or alloys with a melting point above 450° C.

The skilled person would be well aware that the soldering/brazing temperature will depend on the metals/alloys being used, and also depend on the application for which they are being used.

In accordance with the present invention, the DES based fluxes can also be used to bond reactive metals such as Al for applications in heat sink bonding.

The DES ionic liquids are also a good electrolyte medium offering a wide electrochemical window, high current efficiency and good solubility for metal salts. In particular, DES have a high thermal stability, high miscibility with water and a high solubility of bulk metal oxides and other metal salts often found in surface residues as well as organic adsorbates.

The effectiveness of solder/braze bonding is tested using:
(i) x-ray dispersive analysis (EDAX) and scanning electron microscopy for characterisation of bond interfaces and intermetallic phases; SEM and EDAX—SEM and EDX line analysis were recorded on a Phillips XL-30 Field Emission Gun scanning electron microscope (FEG SEM) equipped with a Bruker AXS XFlash 4010 EDS detector operating at 25 kV. Secondary electron imaging (SEI) was performed with a working distance of ca. 5 mm and accelerating voltage of approximately 20 kV;
(ii) wetting balance measurements; solder wetting balance measurements were recorded on a Gen3 Systems Must System 2 solder wetting balance machine using an untreated bare Cu wire suspended over a bath of SAC 305 lead free solder at a temperature of 260° C. The wire was immersed to a depth of 5 mm in the solder bath and the resulting force exerted on the Cu wire measured for a period of 20 seconds; and
(iii) Optical profilometry; 3D Microscope-3D optical images were captured on a Zeta Instruments Zeta 2000 optical profiler using the inbuilt Zeta3D software version 1.8.5.

Certain embodiments of the invention are illustrated by way of the following examples.

EXAMPLES

Figure 2:
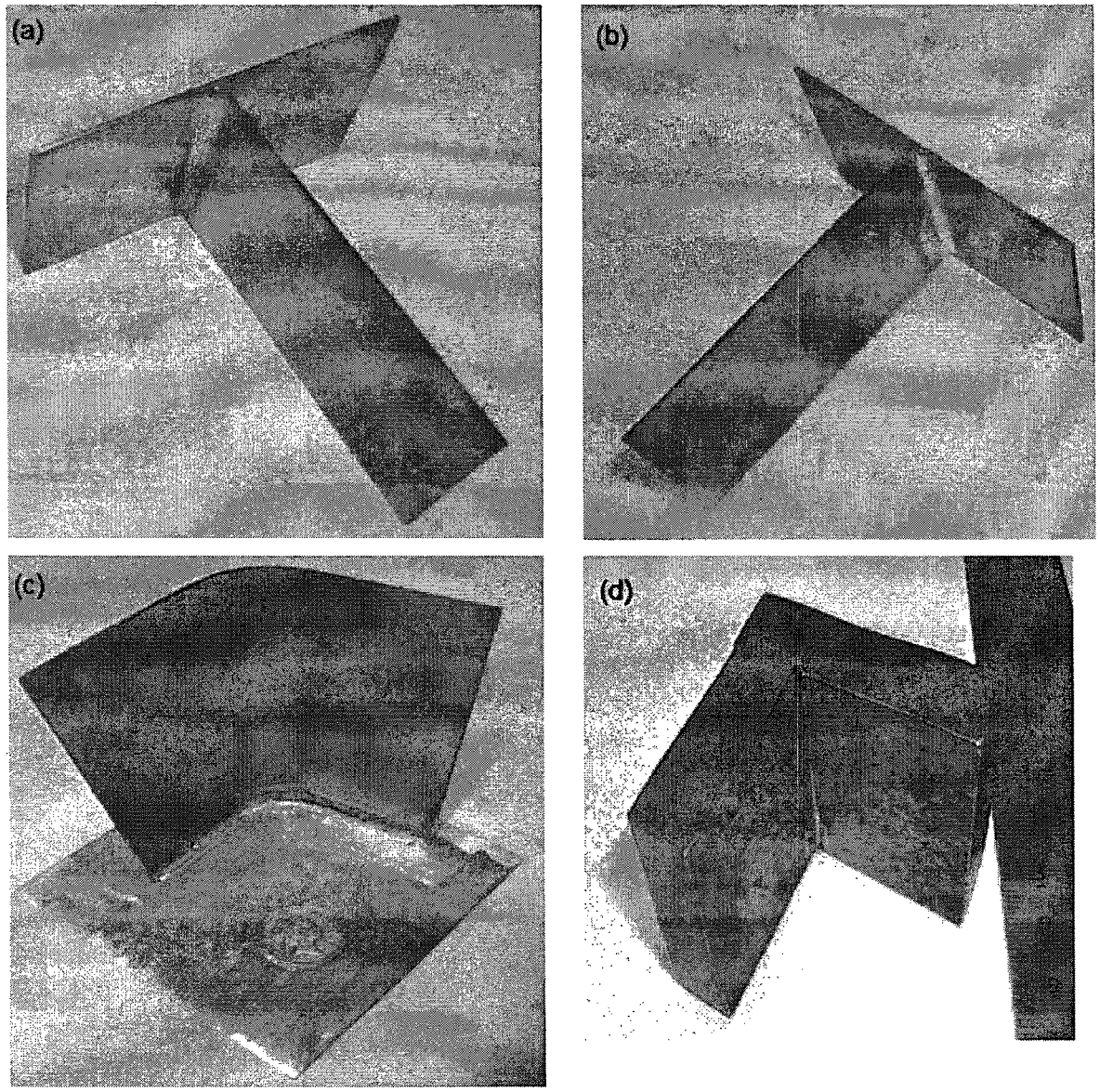
FIG. 2 shows solder joints with the substrates (a) brass, (b) nickel, (c) stainless steel and (d) cast iron produced using the DES reline 200 as the solder flux (see Examples 2-5).
Figure 3:
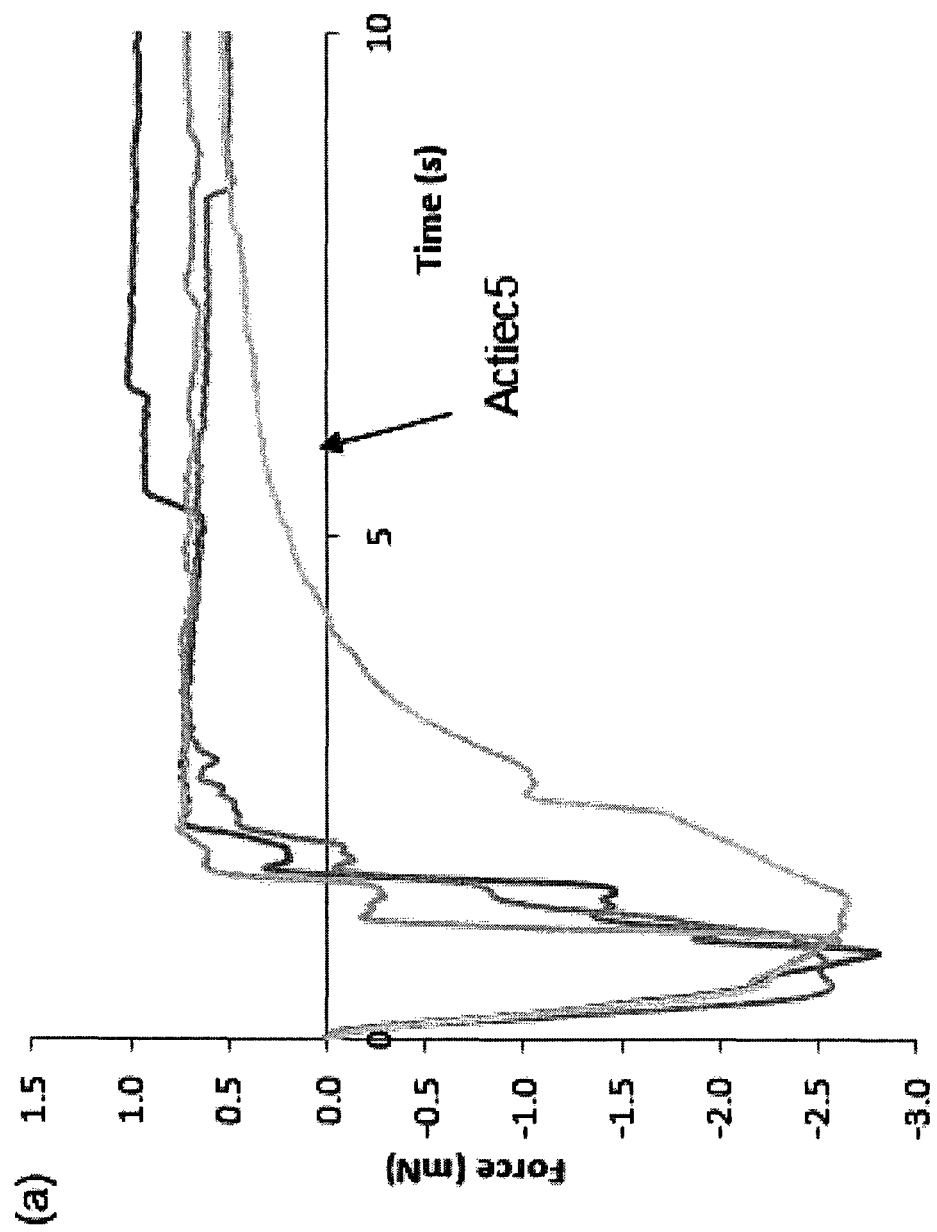
FIG. 3 shows solder wetting balance trace using the DES Reline 200 as a solder flux for (a) uncleaned, untreated Cu wire using SAC 305 solder at 250° C. and (b) stainless steel using SAC 305 solder at 350° C., both at an immersion depth of 5 mm (Examples 7 and 8).
Figure 3:
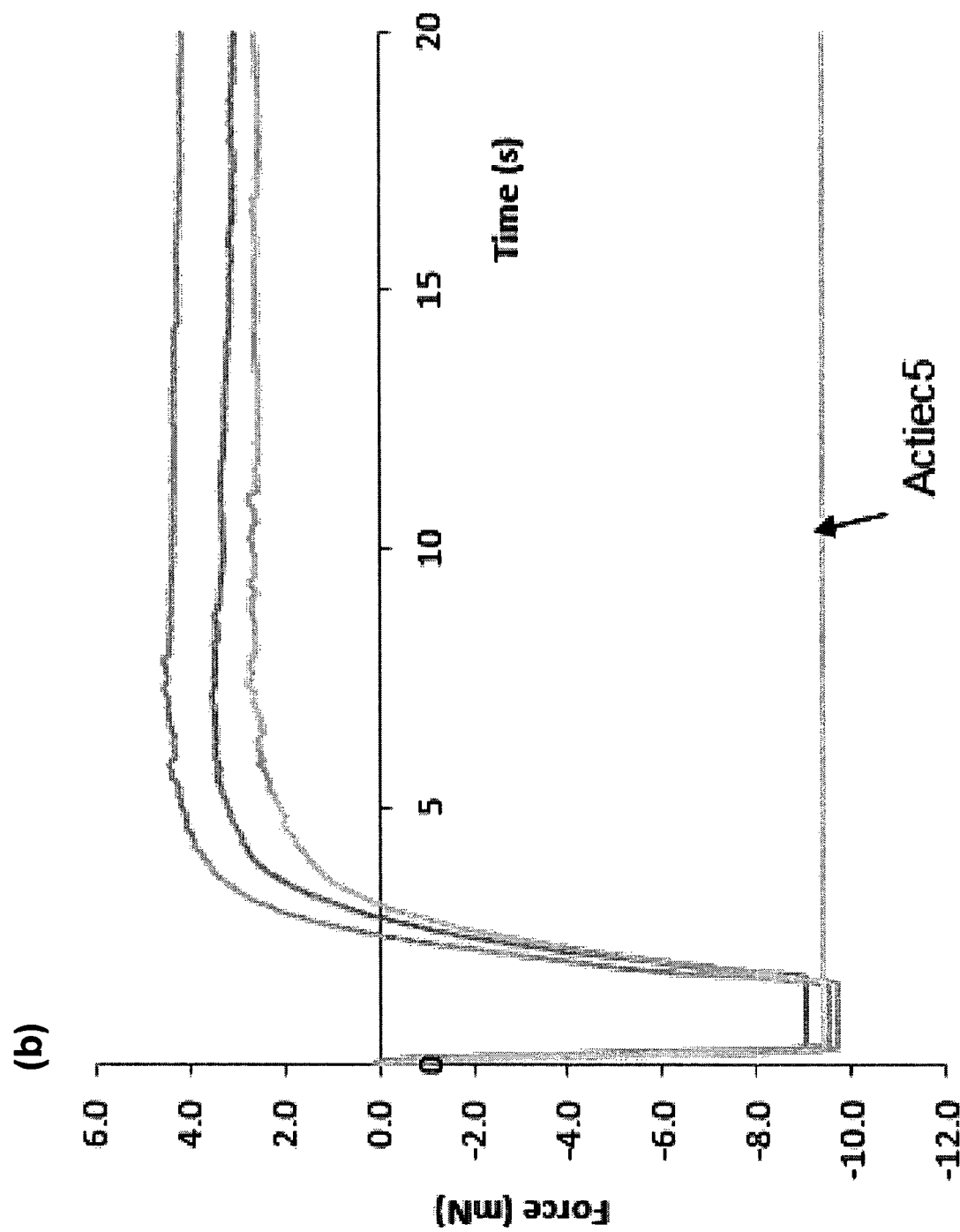

Examples 1-6: Soldering on a variety of substrates using the DES Reline 200 (see FIGS. 1-3, Table 1).

TABLE 1

Qualitative investigation of utility of the DES Reline 200 as a solder flux for a variety of different substrates

| Example | Liquid | Substrate | Outcome |
| --- | --- | --- | --- |
| 1 | Reline | Copper | Solder wets surface readily |
| 2 | Reline | Brass | Solder wets surface readily |
| 3 | Reline | Nickel | Solder wets surface readily |
| 4 | Reline | Stainless Steel | Solder wets surface readily |
| 5 | Reline | Cast Iron | Solder wets surface after prolonged heating and mechanical agitation |
| 6 | Reline | Aluminium | Solder wets surface sparingly after prolonged heating and mechanical agitation |

Figure 1:
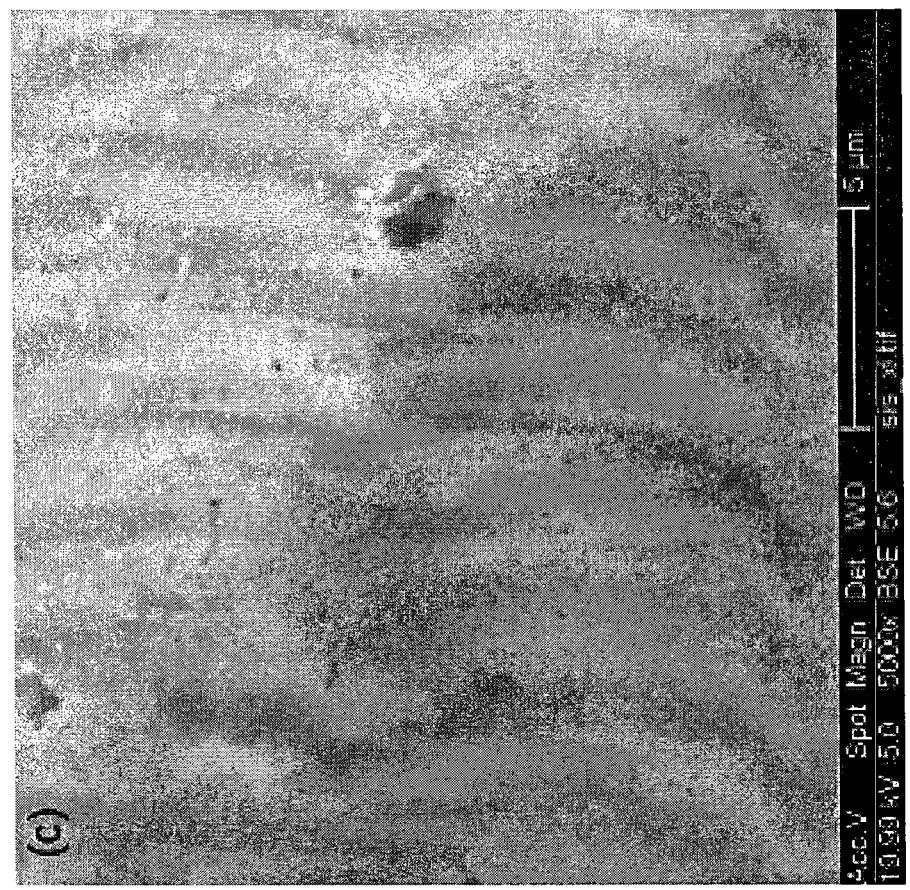
FIG. 1 shows the soldering of copper using SAC305 solder where (a) is a standard soldered piece, (b) is a 3d microscope image of a solder ball which has bonded to a copper sheet and (c) is the cross section of the solder covered Cu piece (see Example 1).
Figure 1:
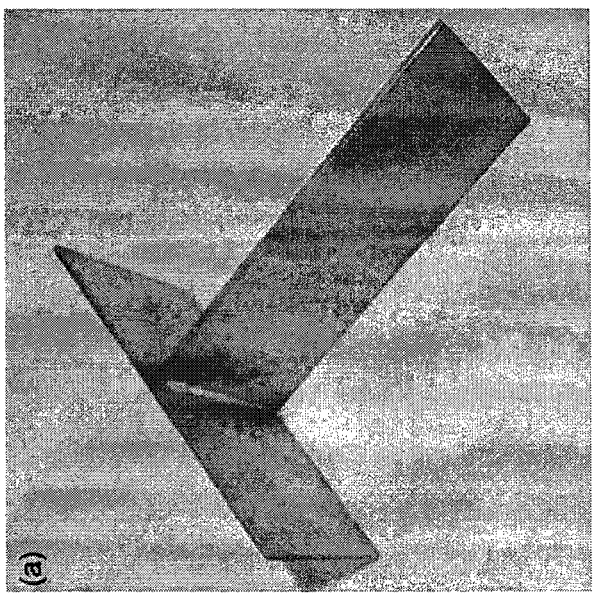
Figure 1:
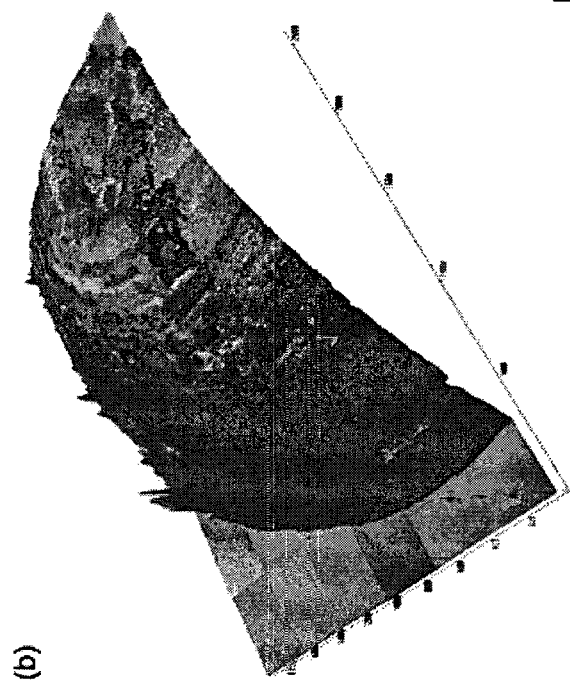

Examples 7 and 8: Solder wetting balance studies of Reline for the substrates copper and stainless steel (see FIG. 3; Examples 1 and 4; FIG. 1 and FIG. 2(c) respectively).

Figure 4:
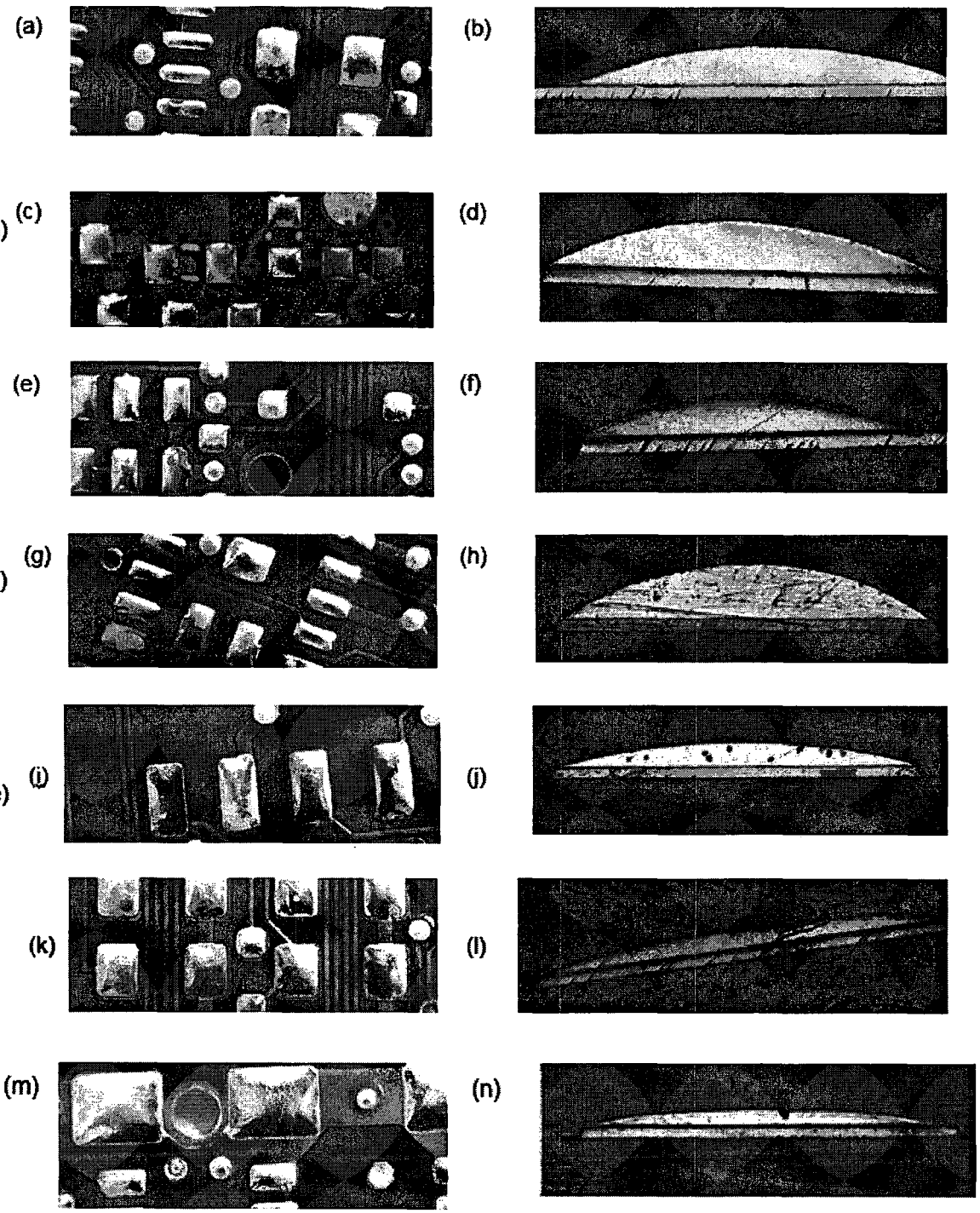
FIG. 4 shows images of pads and cross sections for soldered PCB's where the surface finish was: (a & b) bare Cu (see Example 9), (c & d) electroless nickel immersion gold (see Example 10), (e & f) organic soldering preservative (see Example 11), (g & h) immersion silver (see Example 12), (i & j) immersion tin (see Example 13), (k & l) lead free hot air solder levelling (see Example 14) and (m & n) leaded hot air solder levelling (see Example 15).

Examples 9-15: Qualitative study of the effect of dilution of the DES Reline 200 by 50% v/v with water on the solderability on different PCB surface finishes (see FIG. 4, Table 2).

TABLE 2

Qualitative investigation of utility of the DES Reline 200 diluted 50% v/v with water as a solder flux for a variety of common PCB surface finishes

| Example | Liquid | Surface finish | Outcome |
| --- | --- | --- | --- |
| 9 | Reline | Copper | Uniform solder bond formed |
| 10 | Reline | Electroless nickel immersion gold | Uniform solder bond formed |
| 11 | Reline | Organic Soldering Preservative | Uniform solder bond formed |
| 12 | Reline | Immersion Silver | Uniform solder bond formed |
| 13 | Reline | Immersion Tin | Uniform solder bond formed |
| 14 | Reline | Tin Hot Air Solder Levelling | Uniform solder bond formed |
| 15 | Reline | Lead Hot Air Solder Levelling | Uniform solder bond formed |

Figure 5:
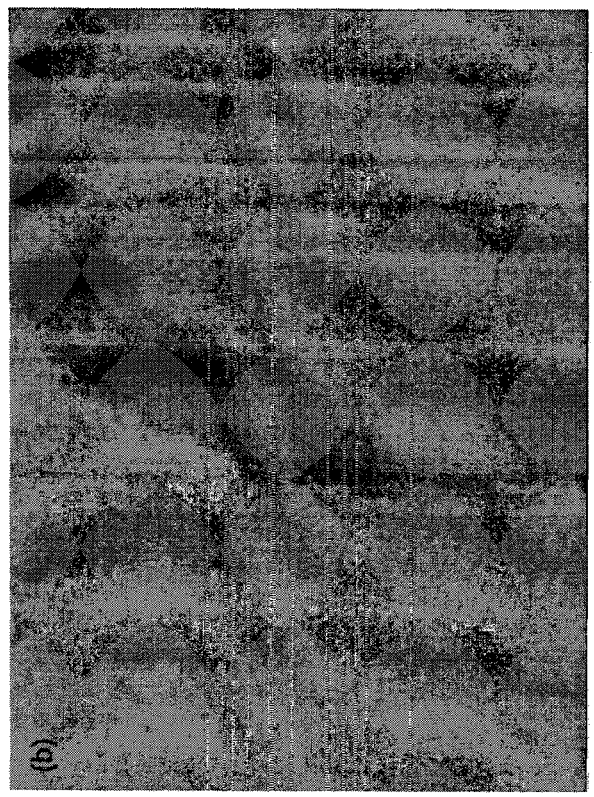
FIG. 5 shows images of cross section of plated through holes which have been filled with solder during Tri-moore testing using the DES Reline 200 diluted by 50% v/v with water as a solder flux (see Example 16).
Figure 5:
Figure 6:
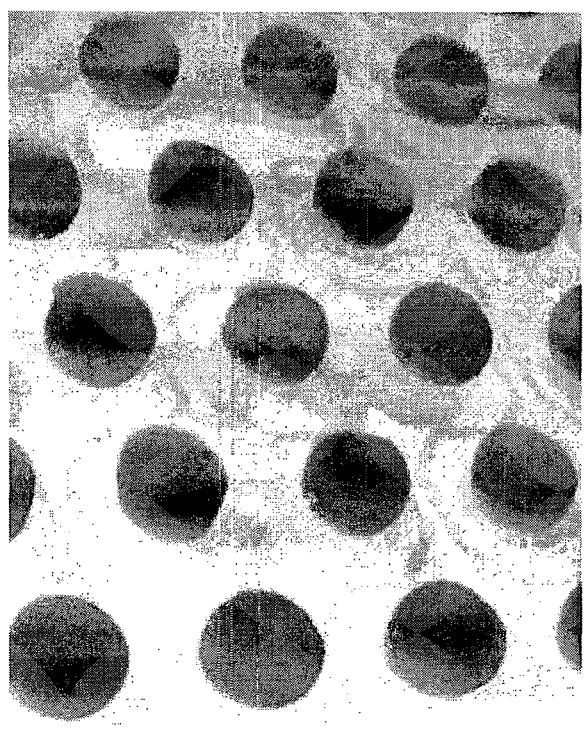
FIG. 6 shows (a) optical image of micro-section and (b) x-ray microscope image of a soldered BGA component that was soldered using the DES Reline 200 diluted 50% v/v with water as the solder flux (see Example 17).
Figure 6:
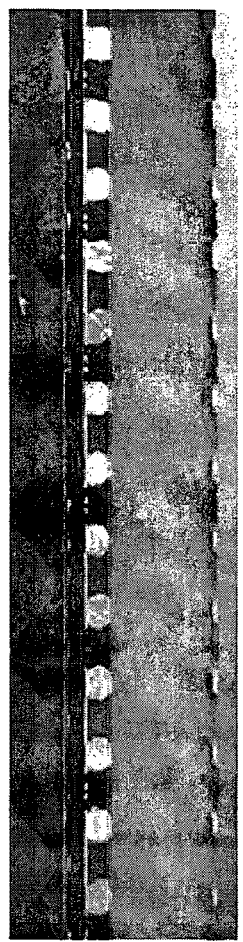

Examples 16 (FIG. 5) and 17 (FIG. 6): Use of the DES Reline 200 for the soldering of a variety of different PCB mounting methodologies (see Table 3).

TABLE 3

Qualitative investigation of utility of the DES Reline 200 for a variety of common PCB mount methodologies.

| Example | Liquid | Mount method | Outcome |
| --- | --- | --- | --- |
| 16 | Reline | Plated through holes | Uniform solder bond formed |
| 17 | Reline | Ball grid array (BGA) | Uniform solder bond formed |

Figure 7:
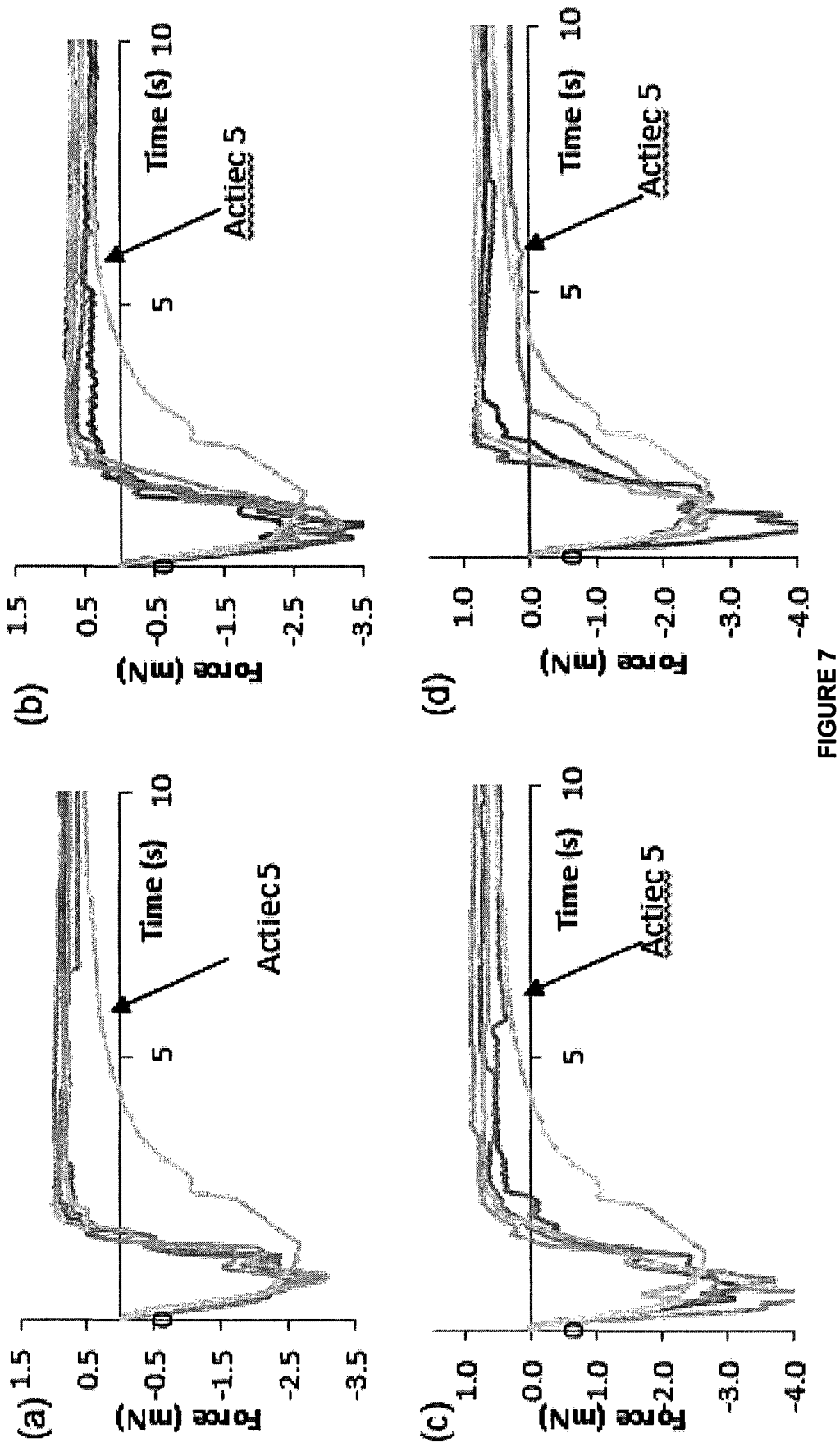
FIG. 7 shows solder wetting balance traces for the DES Reline 200 as a solder flux for Cu wire using SAC 305 solder at 250° C. and an immersion depth of 5 mm where the DES was diluted with water to (a) 50, (b) 30, (c) 20, (d) 10, (e) 5 and (f) 2.5% v/v (see Examples 18-23).
Figure 7:
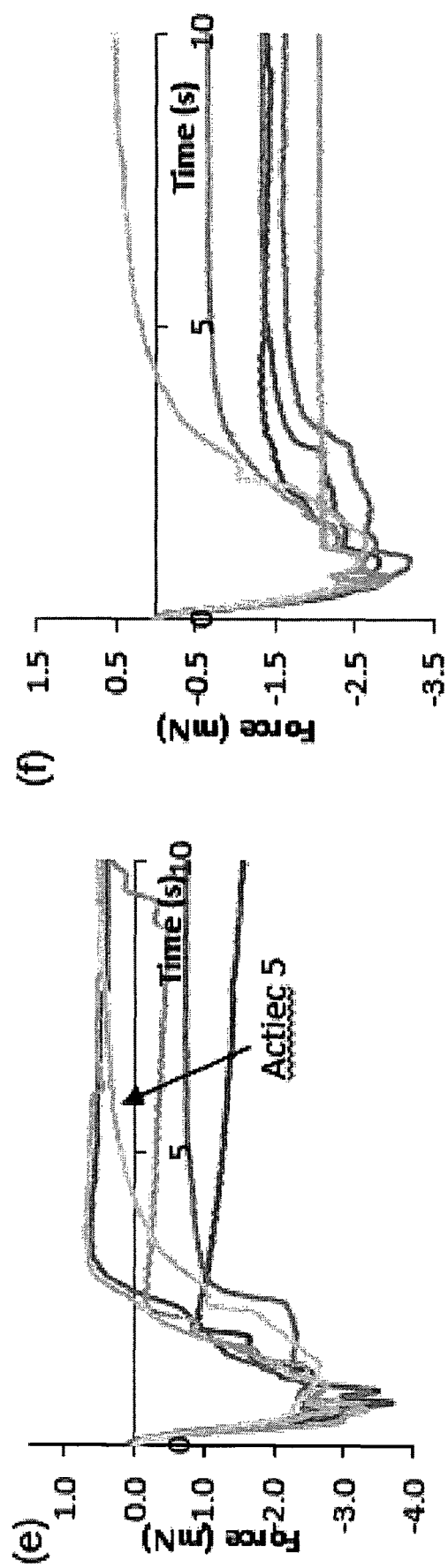

Examples 18-23: Solder wetting balance trials testing the efficacy of the DES Reline 200 as a solder flux for copper wire at a variety of dilutions with water (see FIG. 7 and Table 4).

TABLE 4

Summation of solder wetting balance results for various dilutions of the DES Reline 200 with water

| Example | Liquid | % v/v in water | Outcome |
| --- | --- | --- | --- |
| 7 | Reline 200 | 100 | Surface wets rapidly |
| 18 | Reline 200 | 50 | Surface wets rapidly |
| 19 | Reline 200 | 30 | Surface wets rapidly |
| 20 | Reline 200 | 20 | Surface wets rapidly |
| 21 | Reline 200 | 10 | Surface wets rapidly |
| 22 | Reline 200 | 5 | Some results positive, others show limited wetting of surface |
| 23 | Reline 200 | 2.5 | All results show limited wetting of surface |

Examples 24-26

Figure 8:
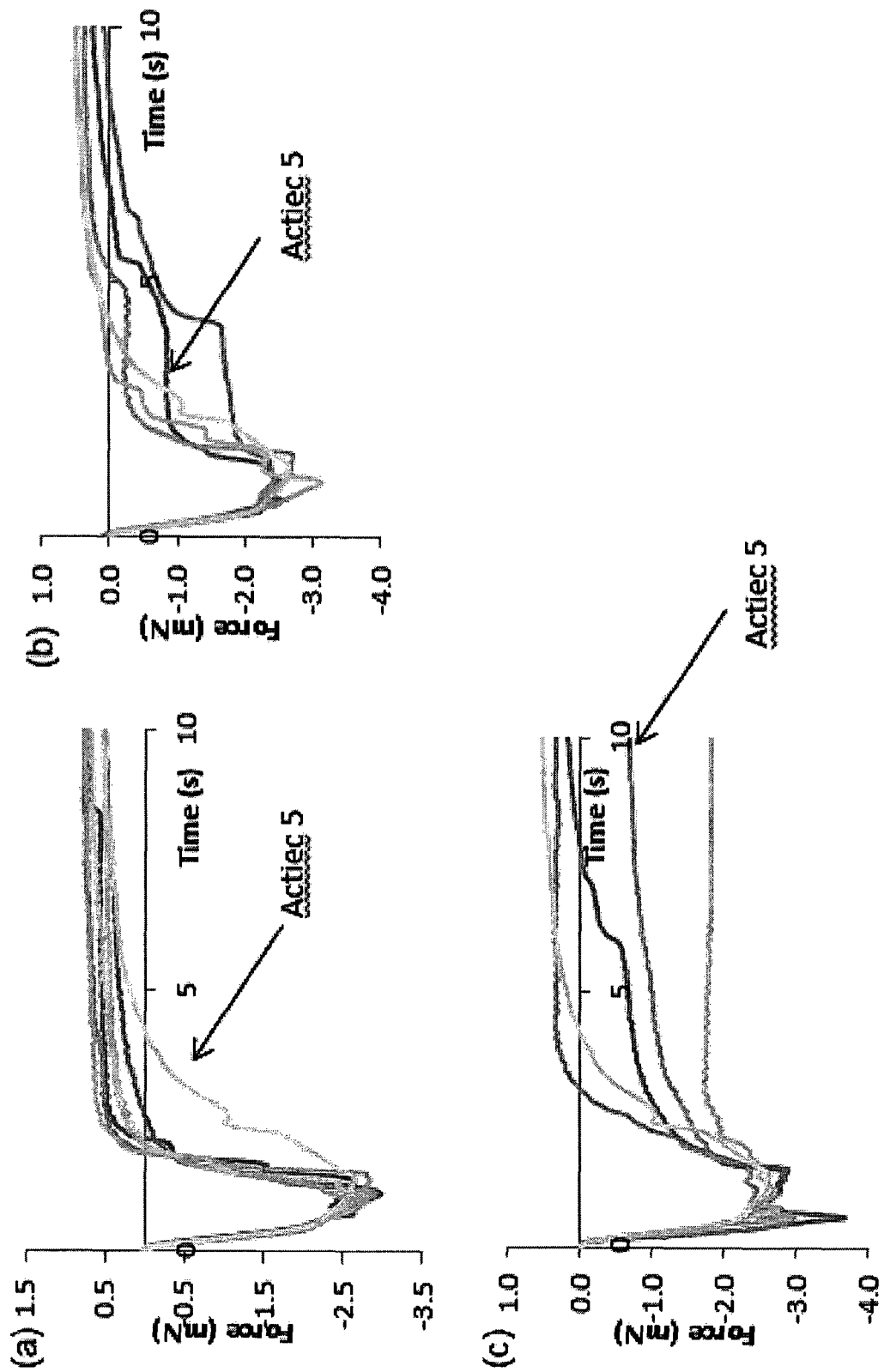
FIG. 8 shows solder wetting balance traces for the DES Glyceline 200 as a solder flux for Cu wire using SAC 305 solder at 250° C. and an immersion depth of 5 mm where the DES was diluted with water to (a) 100, (b) 50 and (c) 25% v/v (see Examples 24-26).

Solder wetting balance trials testing the efficacy of the DES Glyceline 200 as a solder flux for copper wire at a variety of dilutions with water (see Table 5 and FIG. 8).

TABLE 5

Summation of solder wetting balance results for various dilutions of the DES Reline 200 with water

| Example | Liquid | % v/v in water | Outcome |
| --- | --- | --- | --- |
| 24 | Glyceline 200 | 100 | Surface wets rapidly |
| 25 | Glyceline 200 | 50 | Surface wets but at a slower rate |
| 26 | Glyceline 200 | 25 | Limited wetting of substrate |

Example 27

Figure 9:
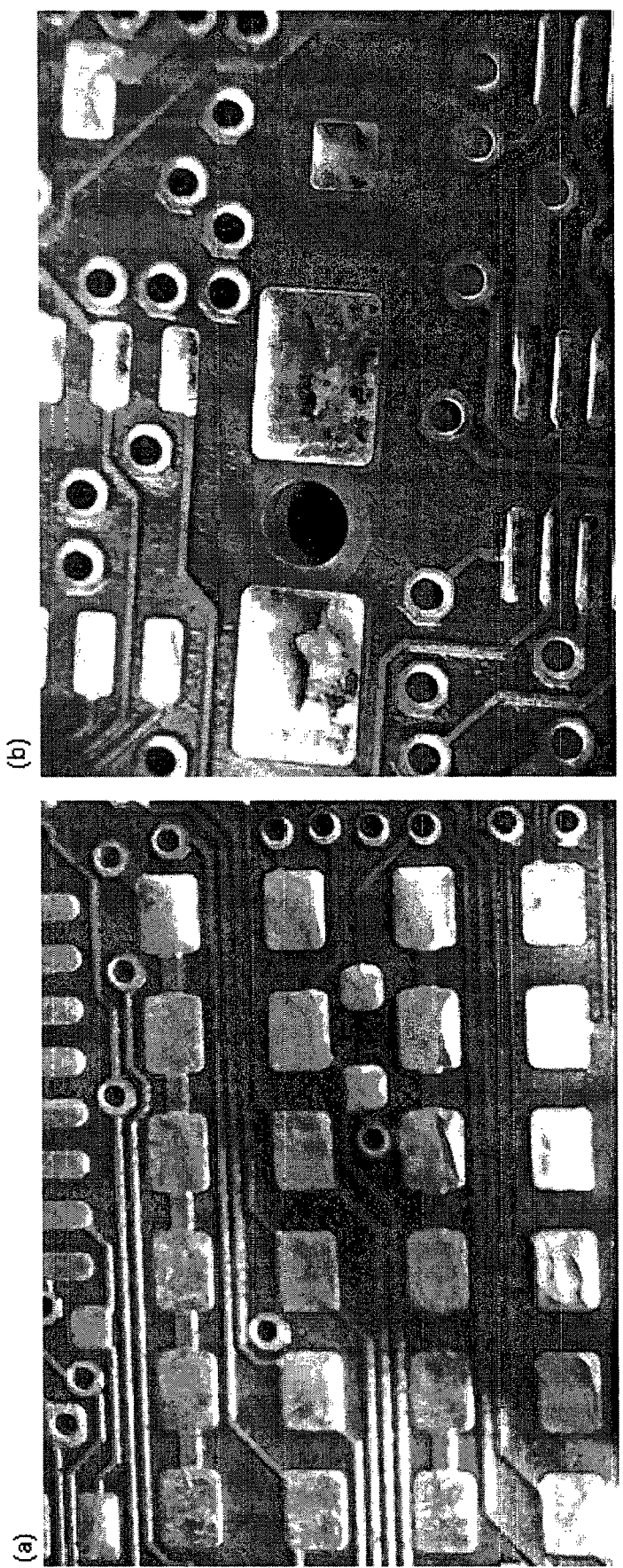
FIG. 9 shows optical microscope images of the surface of a hot air solder levelled surface of (a) bare copper and (b) electroless nickel where flux used was Reline 200 (see Example 27).

Use of DES as a flux for hot air solder levelling of copper and electroless nickel substrates (see FIG. 9).

Examples 28

Figure 10:
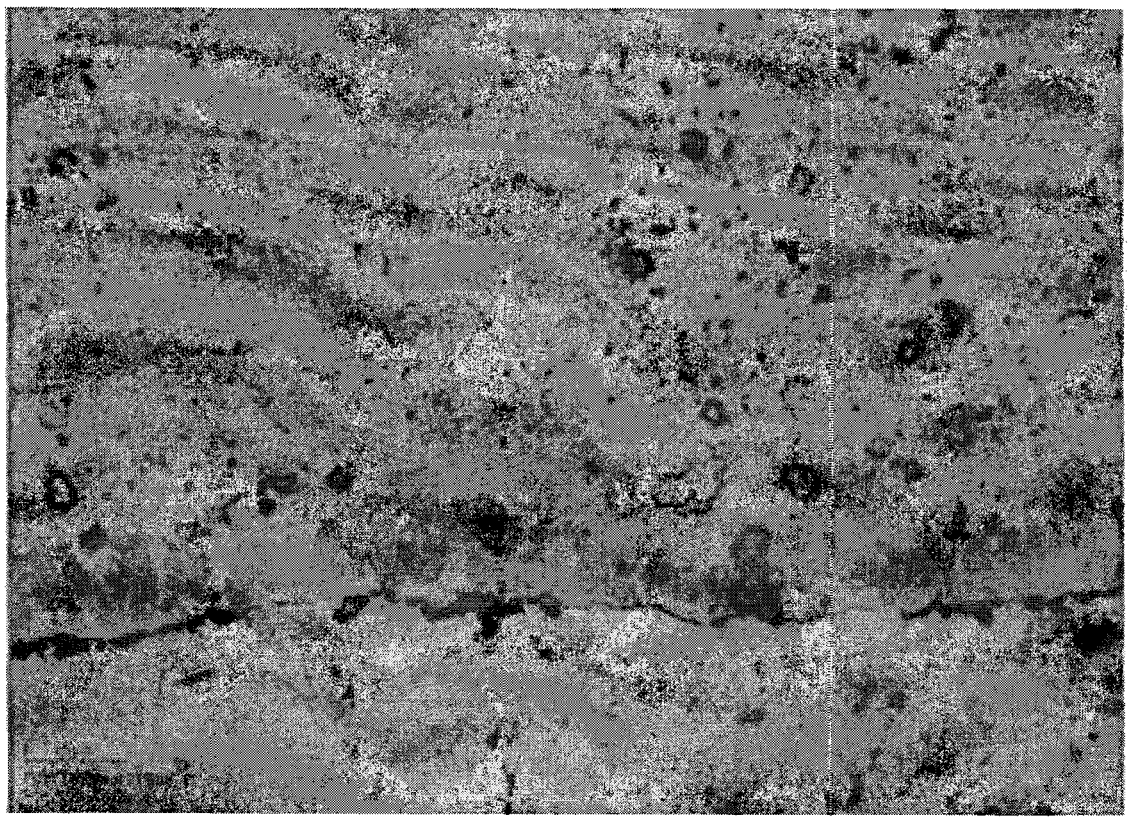
FIG. 10 shows a cross section of solder bond of aluminium with SAC 305 where the flux was 5 wt % KOH in Reline 200 (see Example 28).
Figure 11:
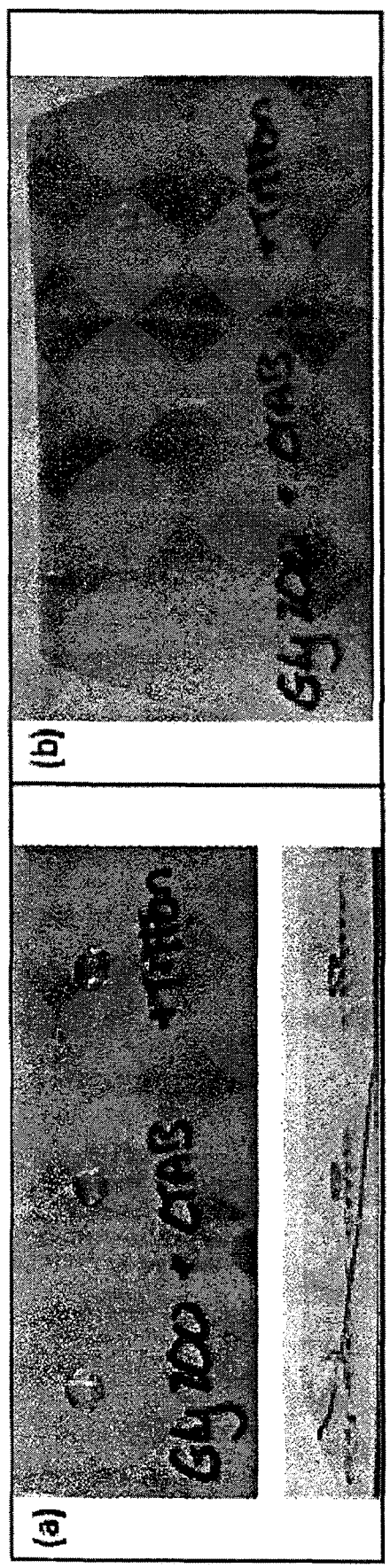
FIG. 11 shows (a) photo's of droplets of Glyceline 200 (left), 10 mM CTAB in Glyceline 200 (centre) and 2 mM Triton X100 in Glyceline (right) on a copper coupon from above and side on view and (b) the same copper coupon that been rotated until one of the droplets had nearly fallen off.
Figure 12:
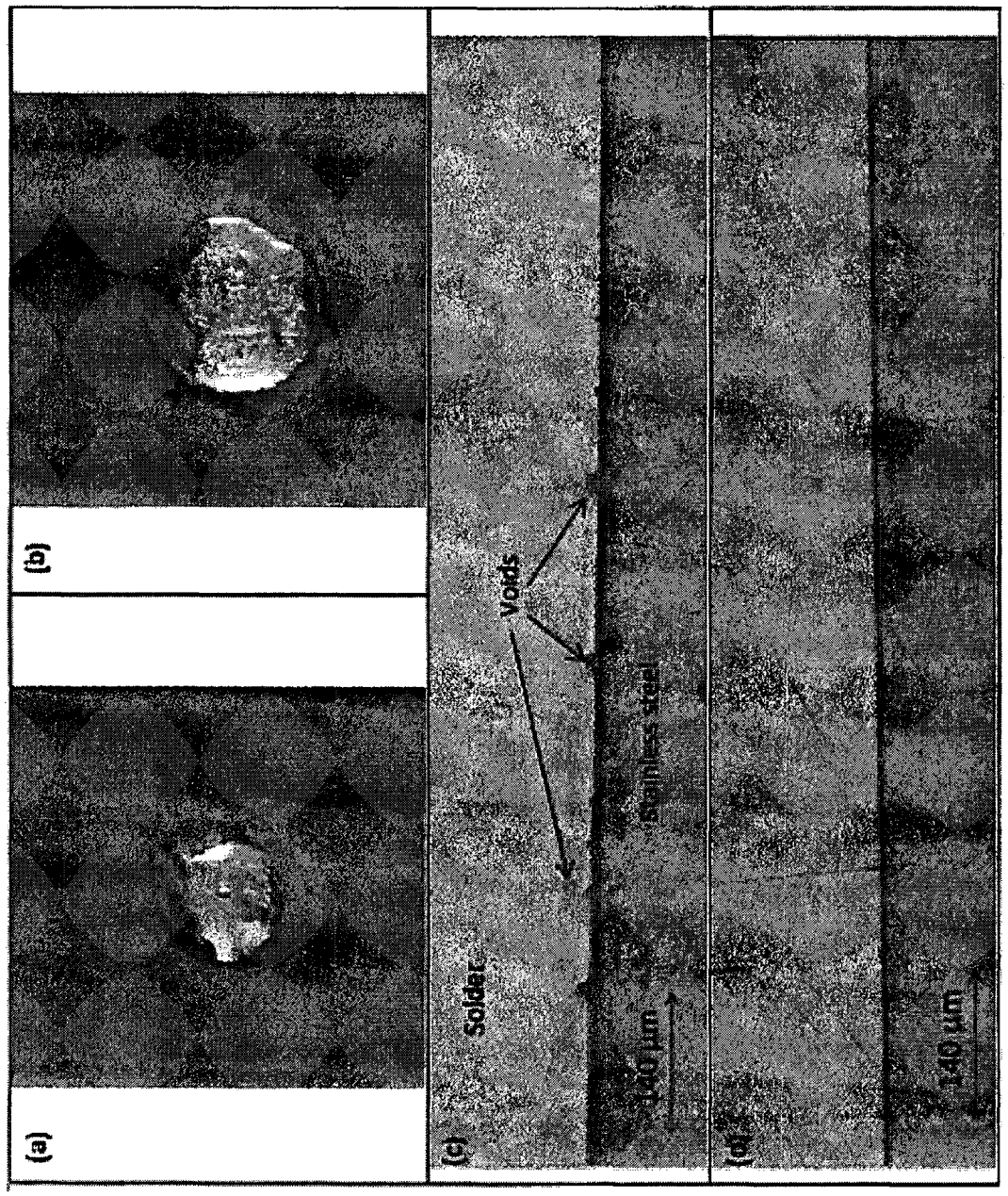
FIG. 12 shows (a) solder ball formed from melting of reline based solder paste on stainless steel at 250° C.; (b) solder ball formed from melting of reline with added hydrochloric acid based solder paste, (c) and (d) are cross-sections from samples (a) and (b) respectively.
Figure 13:
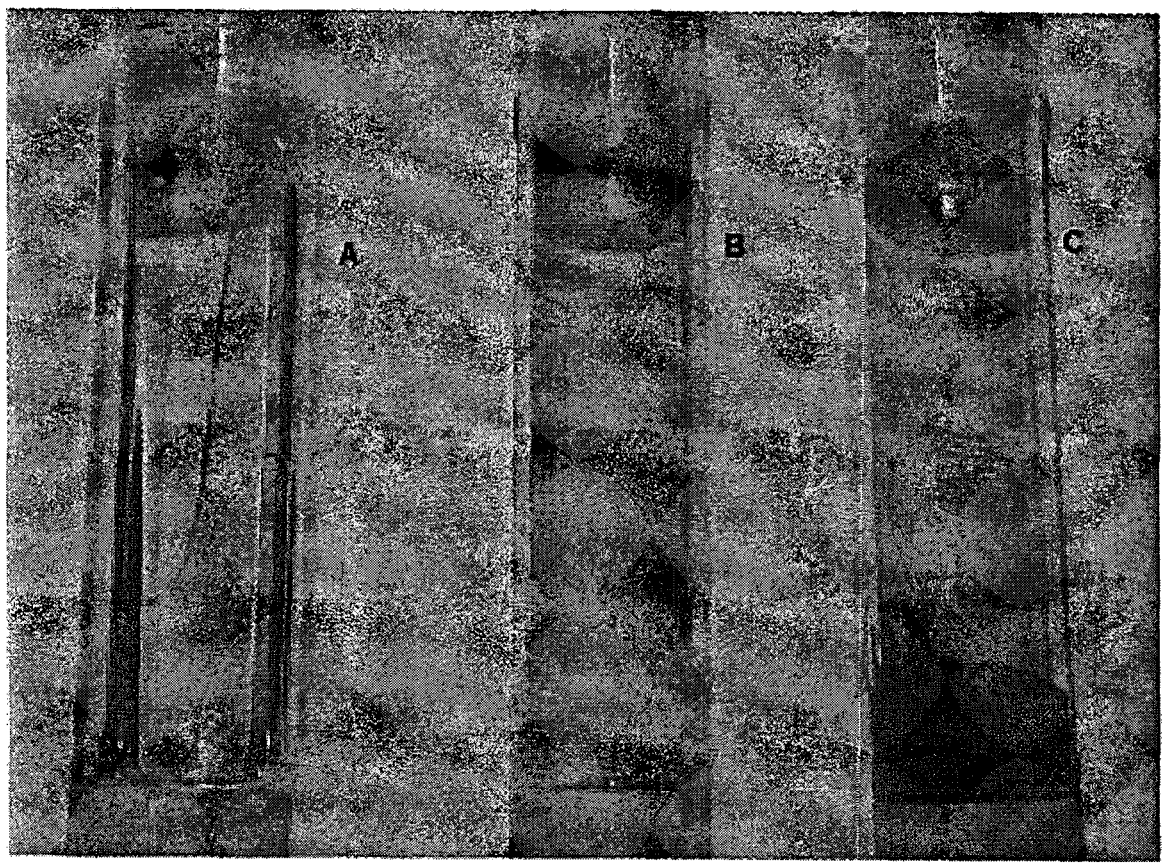
FIG. 13 shows: (a) Reline 200 which is the active component of the solder paste, (b) this is made into a gel by mixing with mixed molecular weights of polyethyleneglycol followed by (c) mixing with solder powder to form a solder paste.
Figure 14:
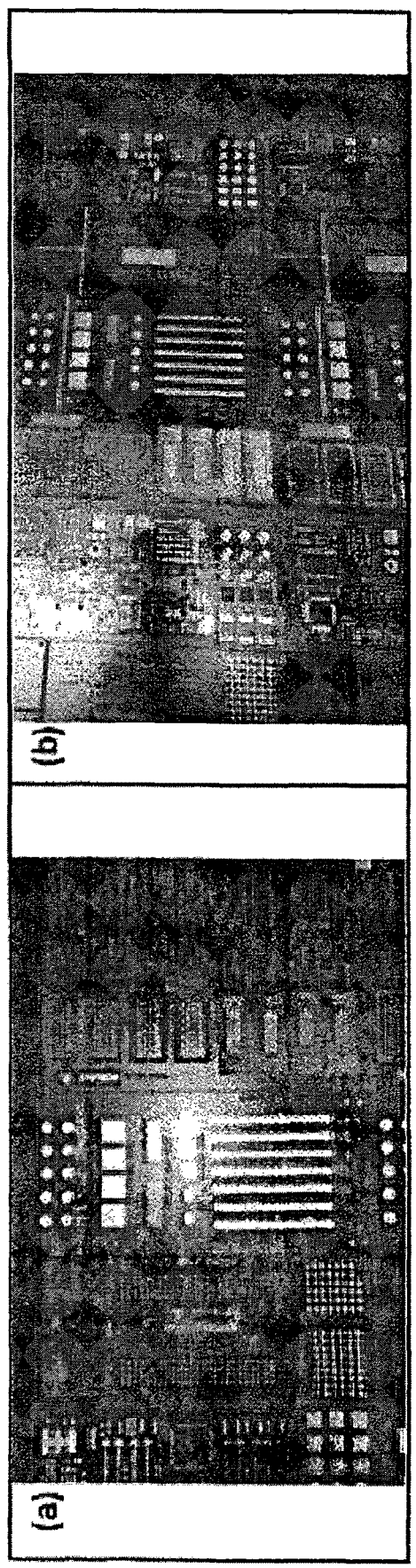
FIG. 14 shows PCB production panel that has been HASL coated using (a) Glyceline 200 as a solder flux; or (b) Glyceline 200 with added 20 wt % polyethyleneglycol 400.

Use of additives to improve solderability of difficult substrates—KOH in Reline for soldering of aluminium (see FIG. 10).

The Applicants have found that a DES electrolyte based on urea and ethylene glycol in combination with choline chloride function as effective solder fluxes and have found that Cu substrate wetting with lead-free SAC305 solder is qualitatively good, indeed better and more rapid with the DES flux than with some commercial Rosin based fluxes.

This is important in the context of the typically used lead-free soldering for two reasons. First, since lead-free solders are generally operated at higher temperatures, faster wetting times are desirable to minimise heat damage to boards and components. Second, good wetting leads to stronger joins and this is a key issue since lead-free solder joins are generally found to be more susceptible to shock damage and failure. Importantly the DES fluxes of the present invention are inexpensive, have low environmental impact and contain no noxious or toxic materials.

In addition the same fluxes can be used to solder/braze a range of other metals including aluminium and steel. The Applicant has also found that DES solders can be formulated to solder unconventional materials such as stainless steel, carbon steel and aluminium for light engineering construction as well as electronics. This presents a unique opportunity for Cu/AI heat-sink bonding methods as well as fabrication of light weight mechanical or electrically conducting architectures. Normally, these metals cannot be joined using soldering methods with conventional flux materials without the use of specialist solders.

PCB cleanliness is a critical requirement of many electronic products. Residues from the flux constituents and their breakdown products can cause in-service failures via corrosion or electro-migration mechanisms and so must be removed. The nature of these residues is such that extensive cleaning is often required and various aqueous-based, organic solvent-based or other cleaning systems are common. The DES fluxes do not breakdown to produce baked-on, hard to remove residues and are readily soluble in water so cleaning, when required, should be easier. This will reduce costs and improve environmental impact. Some fluxes, or formulation variants, can be used to solder join reactive and difficult metals such as aluminium. In the PCB industry bonding technologies are in high demand for the reliable and durable joining of Al heat sink components directly to copper track PCB assemblies for efficient heat transfer.

The invention claimed is:

1. A soldering/brazing flux comprising at least one ionic liquid, which is a Deep Eutectic Solvent (DES), and at least one additive which improves flux functionality, wherein the at least one additive is a rheology modifier and is selected from one or more of:
   (i) ethylene glycol, glycerol and mixtures thereof;
   (ii) a hydrophilic polymer; and
   (iii) a polyol selected from xylitol, erythritol, arabitol, ribitol, sorbitol and mannitol;
   wherein the DES comprises:
   (a) a mixture of two or more compounds of formula (I), $(R^+)_n(X^{n-})$ (I)

or a hydrate thereof, wherein
   n is 1, 2 or 3,
   $R^+$ is a primary, secondary, tertiary, quaternary or unsubstituted ammonium cation or a quaternary phosphonium cation,
   $X^{n-}$ is a monovalent, bivalent or trivalent anion; and
   (b) one or more compounds of formula (IIIa) and/or one or more compounds of formula (IIIb),

(IIIa)

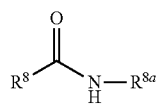

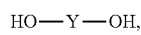

(IIIb)

wherein: $R^8$ represents H, $C_{1-10}$ alkyl optionally substituted by one or more F atoms, phenyl optionally substituted by one or more substituents selected from halogen, $C_{1-10}$ alkyl and $C_{1-10}$ alkoxy or $N(R^9)R^{10}$,
   $R^{8a}$ represents H or $C_{1-10}$ alkyl optionally substituted by one or more F atoms,
   $R^9$ and $R^{10}$ independently represent H or $C_{1-10}$ alkyl optionally substituted by one or more F atoms,
   Y represents $C_{2-10}$ alkylene or $C_{4-8}$ cycloalkylene optionally
      (i) substituted by one or more substituents selected from F, OH, SH, $N(R^{11})R^{12}$ and $C_{1-10}$ alkyl optionally substituted by one or more substituents selected from F and OH, and/or
      (ii) interrupted by one or more groups selected from O, S and $NR^{13}$, and $R^{11}$ to $R^{13}$ independently represent H or $C_{1-10}$ alkyl optionally substituted by one or more substituents selected from F and OH.

2. The soldering/brazing flux according to claim 1 wherein in component (a), $X^{n-}$ is an anion selected from the group consisting of halide, chlorate, perchlorate, bromate, nitrate, nitrite, cyanide, cyanate, thiocyanate, hydrogencarbonate, carbonate, sulfate, hydrogensulfate, pyrosulfate, sulfite, hydrogensulfite, phosphate, monohydrogenphosphate, dihydrogenphosphate, metaphosphate, pyrophosphate, hexafluorophosphate, tetrafluoroborate, borate, diborate, triborate, tetraborate, carboxylate and sulfonate.

3. The soldering/brazing flux according to claim 2 wherein the anion selected from the list comprising fluoride, chloride, bromide, iodide, nitrate and acetate.

4. The soldering/brazing flux according to claim 1 wherein the each compound forming component (b) is an amide or polyol.

5. The soldering/brazing flux according to claim 4 wherein component (b) is one or more compounds selected from the group consisting of benzamide, acetamide, N-methylurea, N,N'-dimethylurea, urea, glycerol, mannitol, xylitol, ethylene glycol and propylene glycol.

6. The soldering/brazing flux according to claim 1 wherein the DES is a mixture of:
   (a) two or more compounds selected from the list comprising benzyltrimethylammonium halide, tetrabutylammonium halide, ethylmethylimidazolium halide, acetylcholine halide and choline halide; and
   (b) one or more compounds selected from the list comprising benzamide, acetamide, N-methylurea, N,N'-dimethylurea, urea, glycerol, mannitol, xylitol and propylene glycol.

7. The soldering/brazing flux according to claim 1, wherein the flux comprises an additional additive which comprises flux functionality, which is selected from at least one of:
   (i) a wetting agent; and
   (ii) a wetting agent improver.

8. The soldering/brazing flux according to claim 7, wherein the wetting agent is a cationic, anionic or non-ionic surfactant.

9. The soldering/brazing flux according to claim 8, wherein the wetting agent is selected from the group consisting of cetyltrimethylammonium bromide, cetyltrimethylammonium chloride, polyoxyethylene octyl phenyl ether, sodium laureth sulfate, cetylpyridinium chloride, benzalkonium chloride, benzethonium chloride, ammonium laureth sulfate, sodium stearate, dioctyl sodium sulfosuccinate, sodium perfluorobutylsulfonate, polyoxyethylene glycol ethers, polyoxpropylene glycol alklyl ethers and polyoxyethylene glycol alkyl phenol ethers.

10. The soldering/brazing flux according to claim 7, wherein the wetting agent improver is an acid or salt.

11. The soldering/brazing flux according to claim 10 wherein the wetting agent improver is an acid selected from the group consisting of hydrobromic acid, hydroioic acid, sufluric acid and phosphoric acid.

12. The soldering/brazing flux according to claim 10 wherein the wetting agent improver is a fluoride-containing salt, wherein the fluoride-containing salt is selected from the group consisting of sodium tetrafluoroborate, ammonium tetrafluoroborate, potassium fluoride, sodium hexafluorophosphate and tetrafluoroboric acid.

13. The soldering/brazing flux according to claim 1, wherein the rheology modifier is a hydrophilic polymer selected from the group consisting of poly (N-isopropylacrylamide), poly (2-oxazoline), polyethylenimine, poly (acrylic acid), poly (vinyl alcohol), poly (vinyl pyrrolidinone), poly (allylamine), poly (vinyl sulfonic acid) and glycerol propoxylate.

14. The soldering/brazing flux according to claim 1 wherein the flux is in the form of a liquid or a paste.

15. The soldering/brazing flux according to claim 1 wherein the flux is diluted to 2.5% v/v with a solvent.

16. The soldering/brazing flux according to claim 1, wherein the rheology modifier is poly(ethyleneglycol).

* * * * *